US008567912B2

(12) United States Patent
Lebens et al.

(10) Patent No.: US 8,567,912 B2
(45) Date of Patent: Oct. 29, 2013

(54) INKJET PRINTING DEVICE WITH COMPOSITE SUBSTRATE

(75) Inventors: John A. Lebens, Rush, NY (US); Cathie J. Burke, Rochester, NY (US); Dino Faralli, Milan (IT)

(73) Assignee: Eastman Kodak Company, Rochester, NY (US)

( * ) Notice: Subject to any disclaimer, the term of this patent is extended or adjusted under 35 U.S.C. 154(b) by 449 days.

(21) Appl. No.: 12/768,759

(22) Filed: Apr. 28, 2010

(65) Prior Publication Data

US 2011/0267404 A1 Nov. 3, 2011

(51) Int. Cl.

| | |
|---|---|
| ***B41J 2/14*** | (2006.01) |
| ***B41J 2/16*** | (2006.01) |
| ***H01L 21/00*** | (2006.01) |

(52) U.S. Cl.

USPC ............ 347/47; 438/21

(58) Field of Classification Search

USPC ............ 438/21; 347/47, 50

See application file for complete search history.

(56) References Cited

U.S. PATENT DOCUMENTS

| | | | |
|---|---|---|---|
| 4,611,219 A | 9/1986 | Sugitani et al. | |
| 4,899,181 A | 2/1990 | Hawkins et al. | |
| 6,505,921 B2 | 1/2003 | Chwalek et al. | |
| 7,255,425 B2 | 8/2007 | Lai et al. | |
| 7,290,866 B2 * | 11/2007 | Sugahara | 347/68 |
| 2002/0153346 A1 | 10/2002 | Kawamura et al. | |
| 2003/0052944 A1 | 3/2003 | Scheffelin et al. | |
| 2005/0110829 A1 | 5/2005 | Keenan et al. | |
| 2006/0055738 A1 | 3/2006 | Parish et al. | |

FOREIGN PATENT DOCUMENTS

| | | |
|---|---|---|
| DE | 32 50 105 c2 | 2/2001 |
| JP | 58 116164 | 7/1983 |
| WO | 2010/044775 | 4/2010 |

OTHER PUBLICATIONS

Merriam-Webster's Online Dictionary: Dimension, Definition 1d.*

* cited by examiner

*Primary Examiner* — Lisa M Solomon

(74) *Attorney, Agent, or Firm* — Peyton C. Watkins

(57) ABSTRACT

An inkjet printhead die for an inkjet print head, wherein the inkjet printhead die comprises a composite substrate that includes a planar semiconductor member, a planar substrate member and an interface at which the planar semiconductor member is fused to the planar substrate member.

5 Claims, 33 Drawing Sheets

INKJET PRINTING DEVICE WITH COMPOSITE SUBSTRATE

FIELD OF THE INVENTION

This invention relates generally to the field of inkjet printing, and more particularly to ink passages in a printing device.

BACKGROUND OF THE INVENTION

Inkjet printing has become a pervasive printing technology. Drop-on-demand (DOD) inkjet printing systems are relatively inexpensive and are capable of meeting high quality printing needs of the home or office. DOD printing systems include one or more arrays of drop ejectors provided on a DOD inkjet printing device, in which each drop ejector is actuated at times and locations where it is required to deposit a dot of ink on the recording medium to print the image. In addition to the drop forming mechanism (e.g. a heater or a piezoelectric structure) and the nozzle making up each drop ejector, there are also one or more ink feed holes through which ink from an ink source is provided to one or more drop ejectors. Thermal inkjet printing devices having several hundred or more drop ejectors per printing device, also typically include driver and logic electronics to facilitate electrical interconnection to the heaters.

Continuous inkjet (CIJ) printing systems provide high throughput printing that is well matched to commercial printing requirements. In CIJ a continuous pressurized stream of ink is emitted from one or more nozzles and broken up into droplets, which are either directed toward the recording medium to make ink dots as needed to print the image, or are directed toward a gutter for recirculation. Controllable drop breakoff can be provided, for example as described in U.S. Pat. No. 6,505,921, by pulsing heaters at intervals that control the drop size. Drops of different sizes are then directed (e.g. by an air stream, or by asymmetric pulsing of heaters on different sides of the nozzle) either toward the recording medium or toward the gutter. Like DOD printing devices, CIJ printing devices also typically include one or more ink feed holes, as well as driver and logic electronics for controlling the heaters.

In order to provide high resolution printing at low cost and high throughput, it is desirable to pack DOD nozzle arrays and ink feed holes at close spacing. Additionally, for CIJ printing devices it can be desirable to enable cross-flow for cleaning between ink feed holes (including cleaning of channels leading to nozzles) for improved long-term printing reliability. In such compact DOD and CIJ printing devices, fabrication challenges arise that can be difficult to achieve using conventional device geometries and fabrication methods Therefore, it would be advantageous to devise novel printing device geometries and fabrication methods that enable achieving one or more of the following requirements:

1) providing fluidic connection to a plurality of closely spaced ink feed holes that are located near a nozzle array, either on the same side or on opposite sides of the nozzle array; and 2) providing reliably sealed fluidic connection of ink supplies to ink feed holes for two different color inks where the ink feed holes for the different inks are significantly less than 1 mm apart on the nozzle face of the printing device.

SUMMARY OF THE INVENTION

The present invention accordingly relates to an inkjet printhead die for an inkjet print head, wherein the inkjet printhead die comprises a composite substrate that includes a planar semiconductor member, a planar substrate member and an interface at which the planar semiconductor member is fused to the planar substrate member.

DETAILED DESCRIPTION OF THE INVENTION

Figure 1:
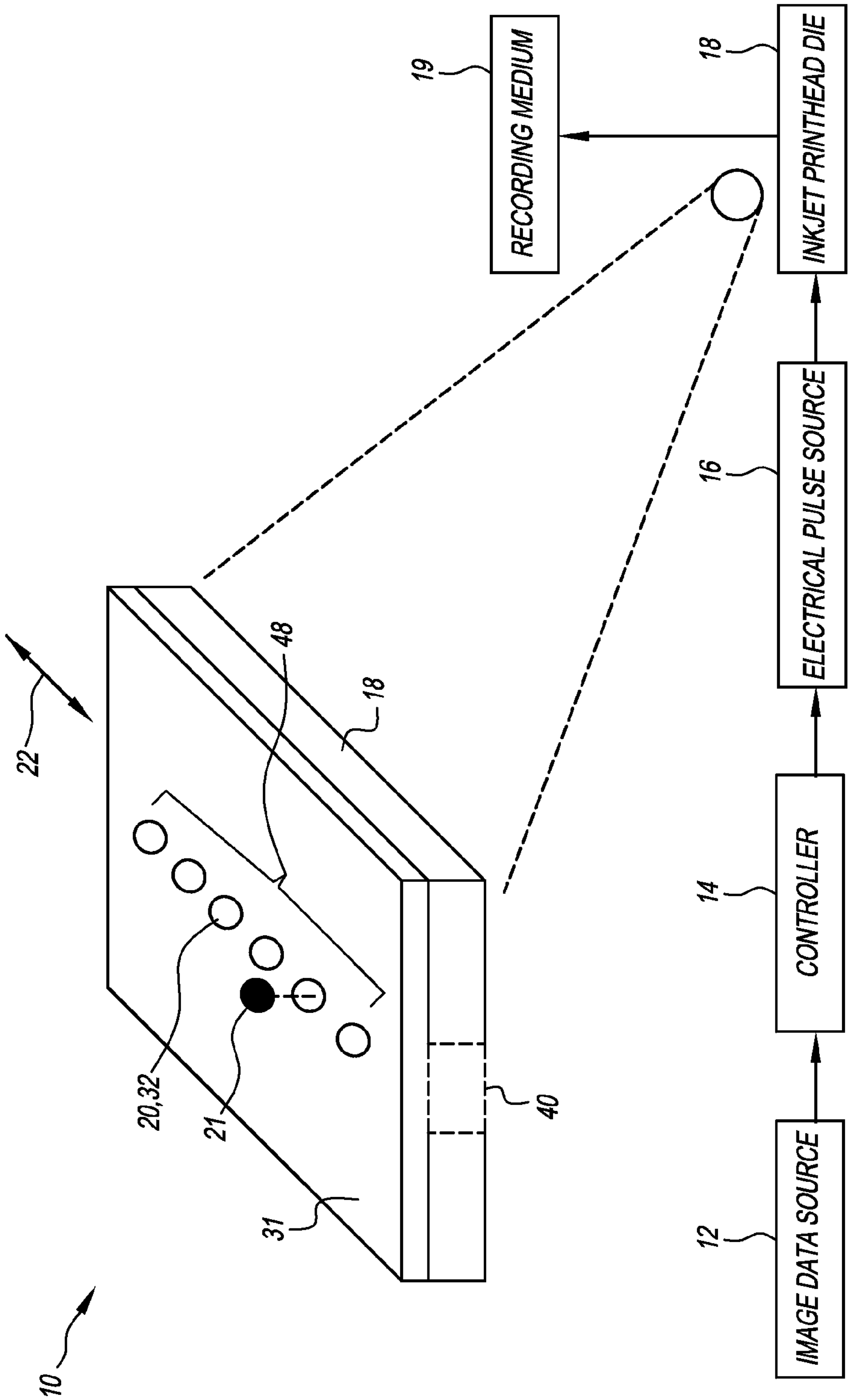
FIG. 1 is a schematic representation of an inkjet printer system.
Figure 2:
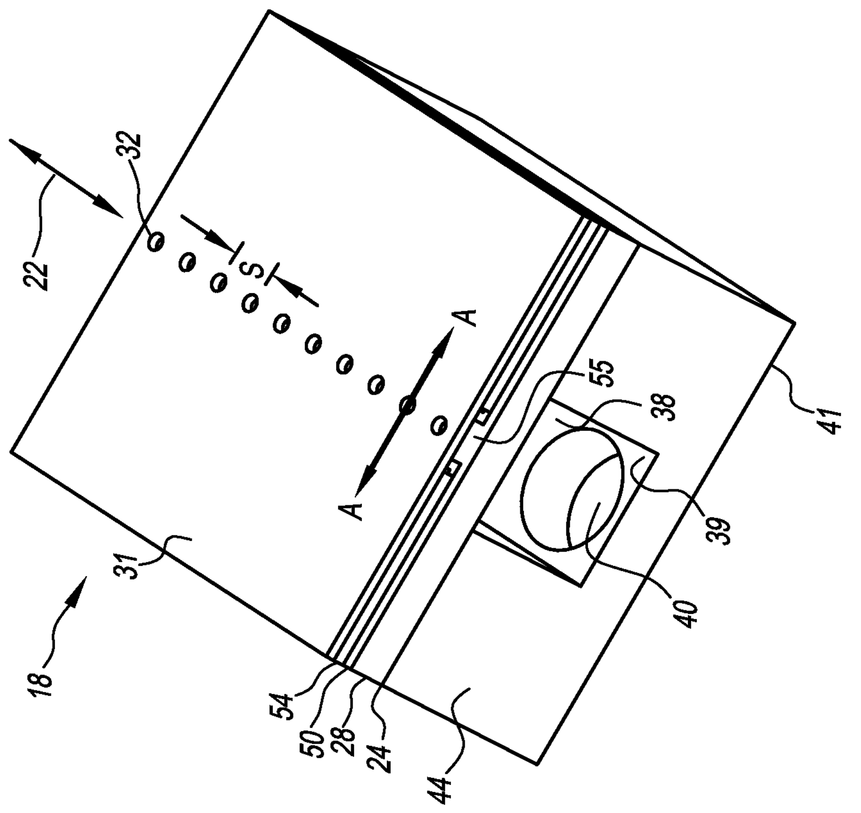
FIG. 2 shows a perspective cut-away view of a portion an inkjet printhead die according to a first embodiment of the present invention.

Referring to FIG. 1, a schematic representation of a drop on demand inkjet printer system 10 is shown. Inkjet printer system 10 includes a source 12 of data (for example, image data) which provides signals that are interpreted by a controller 14 as being commands to eject ink drops. Controller 14 outputs signals to a source 16 of electrical energy pulses which are sent to an inkjet printhead die 18. Controller 14 is preferably, for example, a microprocessor that includes associated software and/or firmware. Typically, inkjet printhead die 18 includes a plurality of drop ejectors 20 arranged in at least one array 48, for example, a substantially linear row disposed along array direction 22. Each drop ejector includes a nozzle 32 formed in a nozzle plate 31. Each drop ejector also includes a chamber, walls and a drop forming mechanism that are not shown in FIG. 1. Ink enters inkjet printhead die 18 from an ink source (not shown) at ink connection hole 40. During operation ink drops 21 are deposited on a recording medium 19 to form an image corresponding to image data from image data source 12. Inkjet printhead die 18 can be mounted on a mounting substrate (not shown) provided with ink passageways and electrical interconnections in order to provide an inkjet printhead FIG. 2 shows a perspective cut-away view (not to scale) of a portion of an inkjet printhead die 18 according to a first embodiment of the present invention. Inkjet printhead die 18 includes a planar semiconductor member 28 and a planar substrate member 44 that are joined together at interface 24 to form a composite substrate. At a first surface 29 (opposite interface 24) of planar semiconductor member 28 are a plurality of layers including an insulating dielectric layer 50, a chamber layer 54, and a nozzle plate 31. Additional layers (not explicitly shown but near dielectric layer 50), can also be included to fabricate drop ejecting structures as well as logic and power electronics, and electrical interconnects. Nozzle plate 31 includes an array of nozzles 32 disposed along array direction 22. Adjacent nozzles are spaced by a center to center spacing S. An end of inkjet printhead die 18 has been cut away in the view of FIG. 2, in order to show an ink passageway 55. In addition, the cut-away view shows channel 38 in planar substrate 44. An ink connection hole 40 extends from the bottom 39 of channel 38 to second surface 41 (opposite interface 24) of planar substrate 44. The area of ink connection hole 40 is typically less than 20% of the area of the bottom 39 of channel 38.

Figure 3:
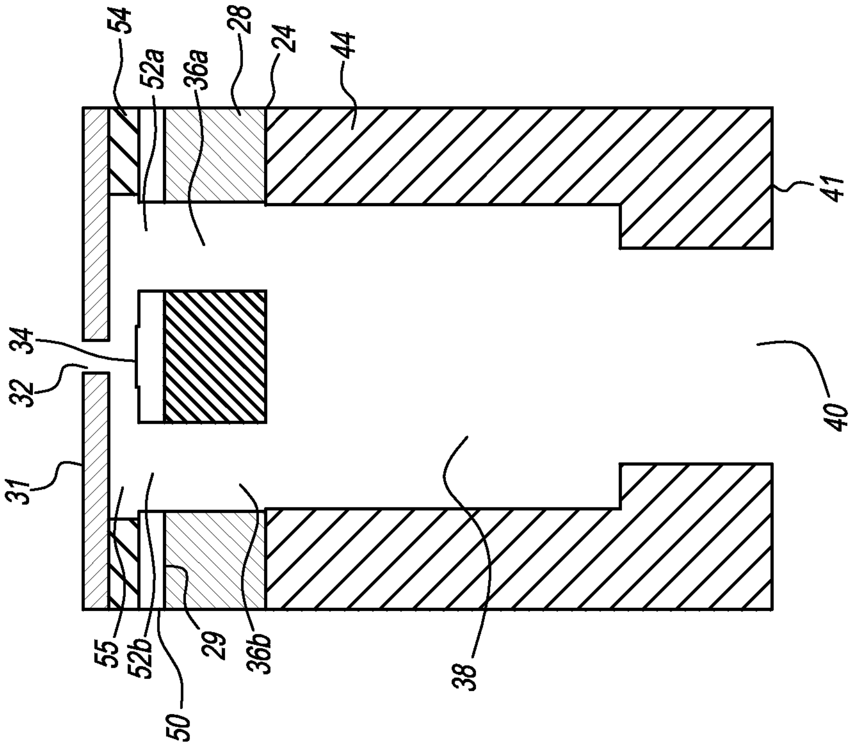
FIG. 3 is a cross-sectional view along line A-A of FIG. 2.

FIG. 3 is a cross-sectional view of printhead die 18 along line A-A of FIG. 2. In addition to the features described above relative to FIG. 2, FIG. 3 shows ink feed holes **36*a* and 36*b*, which are on opposite sides of resistive heater 34. In this embodiment, resistive heater 34 is the drop forming mechanism and inkjet printhead die 18 is a thermal inkjet printhead die. Ink is provided to resistive heater 34 from ink connection hole 40 to channel 38 through planar substrate 44, then to ink feed holes 36*a* and 36*b* in planar semiconductor member 28, then to feed openings 52*a* and 52*b* in dielectric layer 50, and then to ink passageway 55 to resistive heater 34. In other words, these passages are fluidically connected. In particular, channel 38 is fluidically connected to ink feed holes 36*a* and 36*b* at interface 24 between planar substrate 44 and planar semiconductor member 28. Although in the cross-sectional view of FIG. 3, the resistive heater 34 and its underlying structure appear to be freely suspended, in other cross-sections parallel to A-A, it would be seen that portions of planar semiconductor member 28 surrounding ink feed holes 36*a* and 36*b* are connected to the underlying structure of resistive heater 34**.

Figure 4:
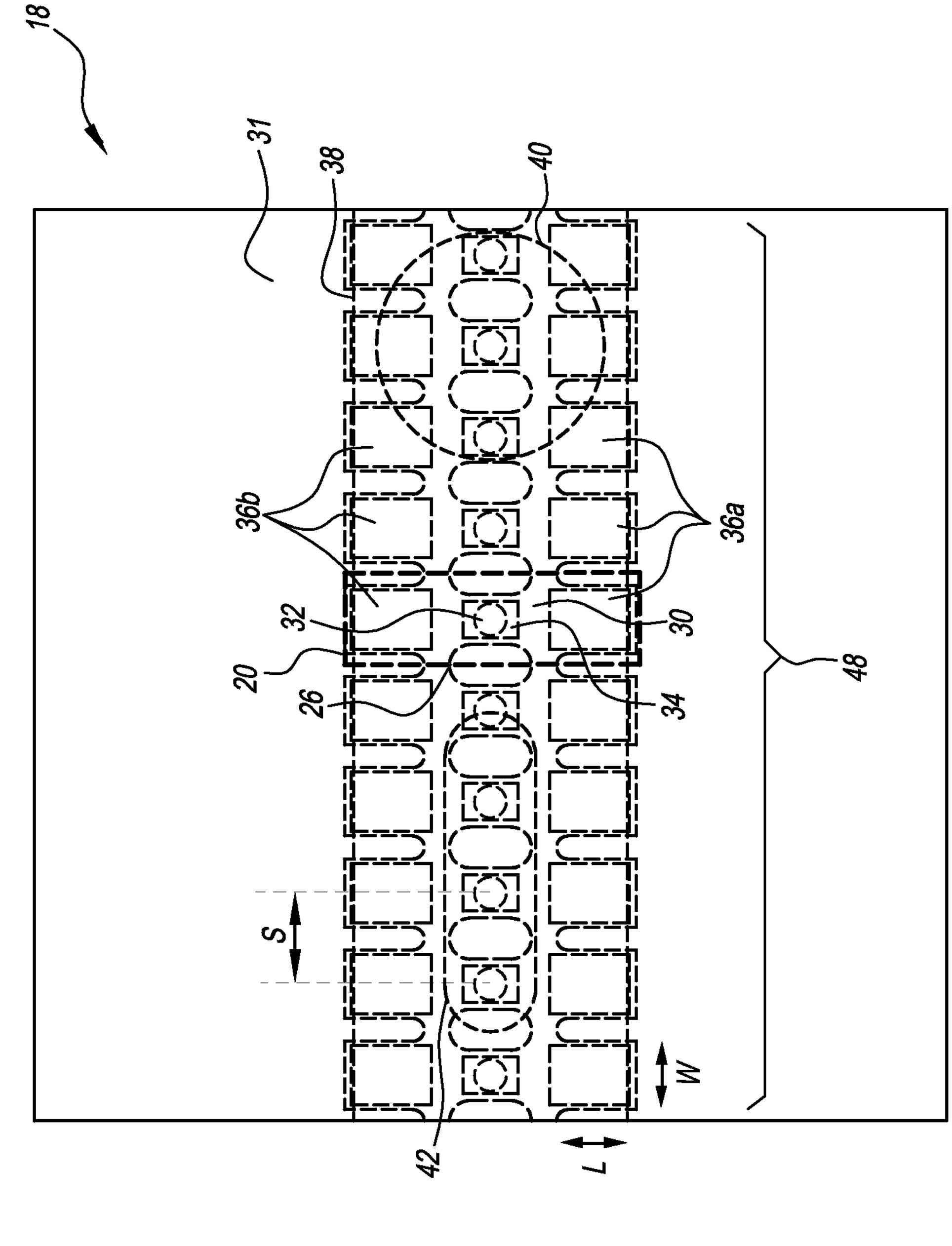
FIG. 4 is a schematic top view of the printhead die of FIG. 2.

Referring to FIG. 4, a schematic representation of a top view (through nozzle plate 31) of a portion of a drop on demand inkjet printhead die 18 is shown in accordance with the first embodiment previously shown in FIGS. 2 and 3. Inkjet printhead die 18 includes an array of drop ejectors 20, one of which is designated by the heavy dashed line in FIG. 4 together with the ink feed holes **36*a* and 36*b* that provide ink. Drop ejector 20 includes walls 26, extending upwardly toward nozzle plate 31 thereby defining a chamber 30. Walls 26 separate adjacent drop ejectors 20 in the array. Each chamber 30 includes a nozzle 32 in nozzle plate 31 through which ink is ejected. A drop forming mechanism, for example, resistive heater 34 is also located in each chamber 30. In FIGS. 3 and 4, the resistive heater 34 is positioned above the top surface of planar semiconductor member 28 in the bottom of chamber 30 and opposite nozzle orifice 32, although other configurations are permitted. In other words, in this embodiment the bottom surface of chamber 30 is above the first surface 29 of planar semiconductor member 28, and the top surface of the chamber 30 is the nozzle plate 31**.

Referring to FIG. 4, the ink feed holes comprise two linear arrays of ink feed holes **36*a* and 36*b* that supply ink to the chambers 30. Ink feed holes 36*a* and 36*b* are positioned on opposite sides of the drop ejector 20 containing chamber 30 and nozzle orifice 32. Referring to FIGS. 3 and 4, the ink feed holes are arranged so that feed holes 36*a* and 36*b* are located on opposite sides of array 48 of drop ejectors 20. Because each drop ejector 20 is fed by more than one ink feed hole 36*a* and 36*b*, this configuration is also called a dual feed drop ejector, and the dual feed drop ejector configuration has high frequency jetting performance. Other geometries of dual feed drop ejectors are disclosed in published patent application US 2008/0180485. Drop ejectors 20 (and corresponding nozzles 32) are formed in a linear array at a high nozzle per inch count. For example if the drop ejector array 48 has 1200 or 600 nozzles per inch, the drop ejectors 20 and their corresponding nozzles will be spaced with a center to center spacing S of about 21 to 42 μm, respectively. In the example of the dual feed drop ejector configuration, the length L of feed holes 36 in a plane of the first surface 29 of planar semiconductor member 28 can vary from 10 μm to 100 μm, depending on the design. The width W of the feedholes 36** can also vary similarly from 10 μm to 100 μm.

Referring to FIGS. 2 and 4, an aspect of the present invention is that channel 38 in planar substrate member 44 is able to connect ink feed holes 36 having small dimensions. For dimensions of L and W ranging from 10 μm to 100 μm and drop ejector spacing S ranging from 21 μm to 42 μm, channel 38 fluidically connects ink feed openings **36*a*, 36*b* having a dimension L or W in the plane of the first surface 29 of planar semiconductor member 28 of less than 5S, and more preferably less than 3S, or even less than S. In the example shown in FIG. 4, channel 38 connects the linear array of ink feed holes 36***a*, 36*b* on one side of drop ejector array 48 so that they can all be supplied with ink. In addition, channel 38 also connects the linear array of ink feed holes 36*b* on the other side of drop ejector array 48 so that they can all be supplied with ink. Ink connection hole 40 (within channel 38) is shown as a dashed circle in FIG. 4. In the ink channel 38 there can be other structures such as support structure 42.

FIGS. 5-13 illustrate a fabrication method of an embodiment of the present invention for forming an inkjet printhead die 18 containing multiple small ink feed holes 36 aligned to drop ejectors 20, for high frequency operation. A flow chart of the step sequence for fabricating inkjet printhead die 18 is shown in FIG. 14.

Figure 5:
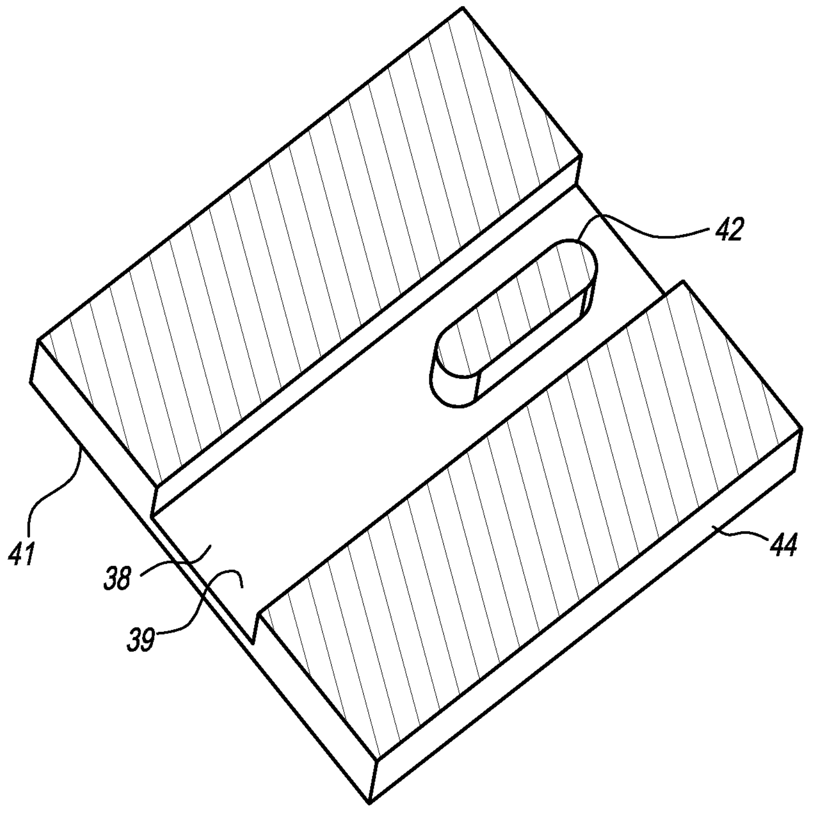
FIG. 5 is a top perspective view of a planar substrate member portion of the printhead die of FIG. 2.

As shown in FIG. 5 and described in box 100 of FIG. 14 a planar substrate member 44, is patterned and channel 38 is etched into a surface, which will subsequently be located at interface 24 with reference to FIG. 2. The planar substrate member 44 is a silicon wafer in the thickness range 300 μm-1 mm with a preferred thickness range of 650-725 μm. The silicon wafer typically has several hundred die sites, a portion of one of which is shown in FIGS. 5-13. The channel 38 is formed by lithographic patterning and deep reactive ion etching of the silicon, as is well known in the art. The depth of the channel 38 is less than the thickness of the planar substrate member 44 and is in the range 300-900 μm with a preferred depth of 400-450 μm. As a result, channel 38 has a bottom 39 and does not extend all the way through to second surface 41. The channel 38 can also contain support structures 42 formed with this etch process.

Figure 6:
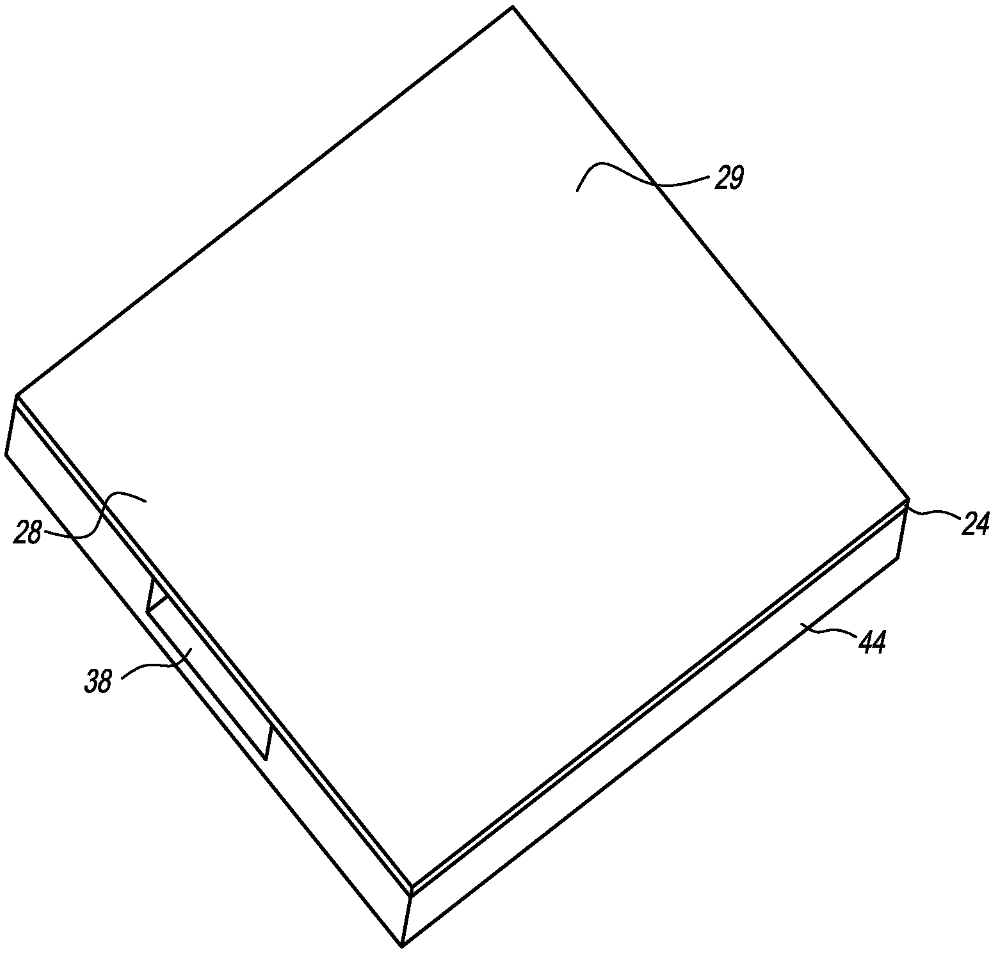
FIG. 6 is a top perspective view of a planar semiconductor member bonded to the planar substrate member of FIG. 5.
Figure 14:
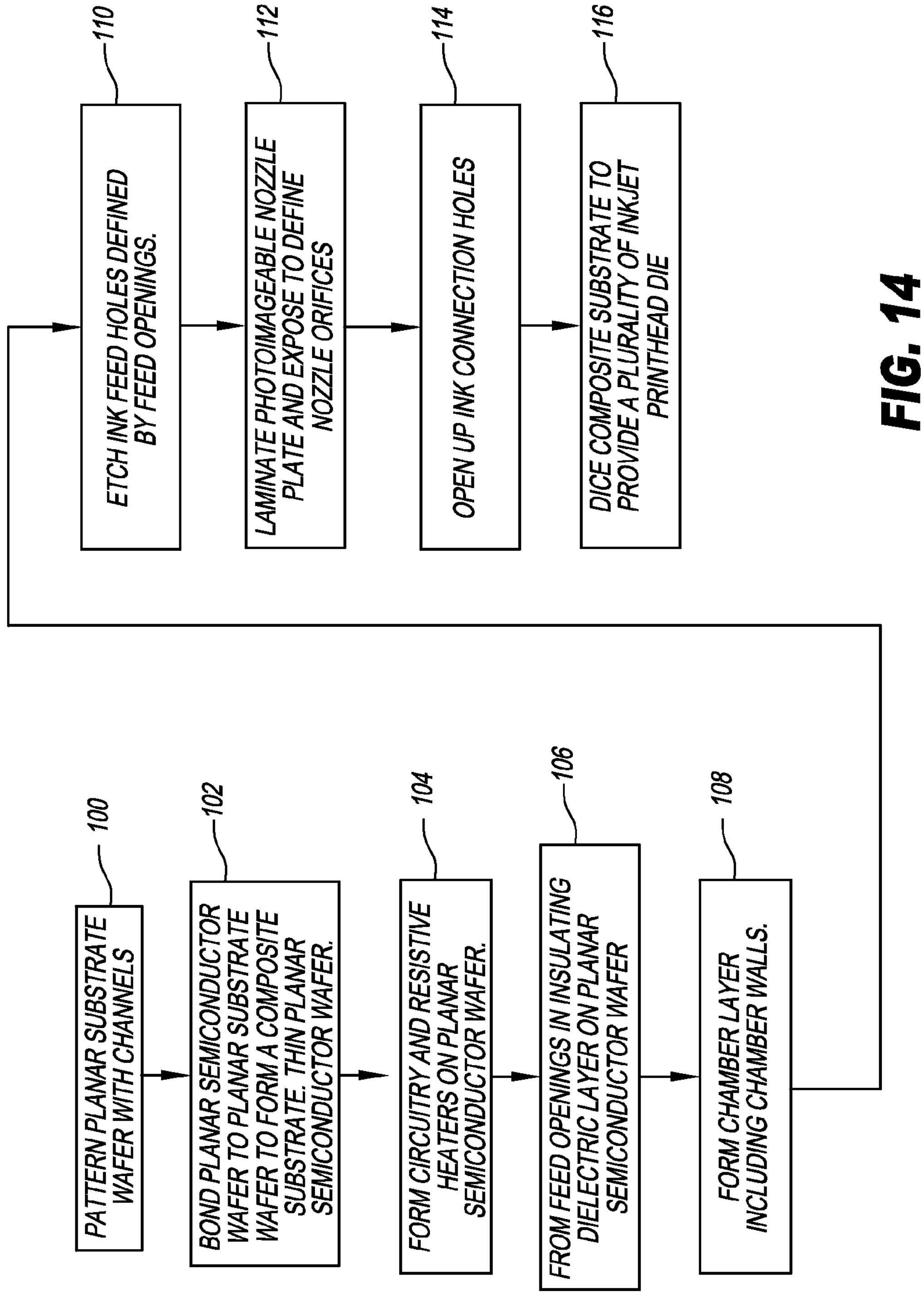
FIG. 14 is a flow chart of a fabrication sequence of steps.
Figure 16:
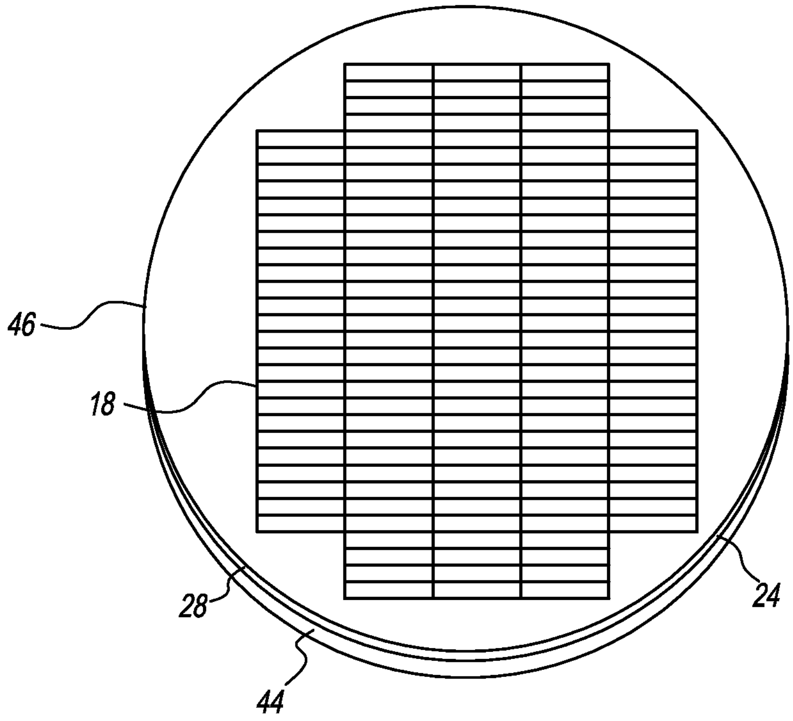
FIG. 16 shows a composite wafer substrate pair and a plurality of die sites.

As shown in FIG. 6 and described in box 102 of FIG. 14 a planar semiconductor member 28 (e.g. a silicon wafer) is bonded to the planar substrate member 44 at interface 24 to form a composite substrate wafer pair 46 with a plurality of die sites for inkjet printhead die 18 (with reference to FIG. 16). The bonding of the two wafers can be done by high temperature fusion bonding of the two surfaces at interface 24. Prior to bonding, a thermal oxide can be formed on the planar substrate member 44 and/or planar semiconductor member 28. The bonded planar semiconductor member 28 can be of any initial thickness and then thinned after the bonding step. FIG. 6 shows the planar semiconductor member 28 after the thinning process, where the thickness of the planar semiconductor member 28 is in the range 50-400 μm with a preferred thickness of 50-100 μm. First surface 29 of planar semiconductor member 28 is the top surface after the thinning process, and is thus less than 200 μm from the interface 24 in a preferred embodiment. In a preferred embodiment the thickness of the planar substrate member 44 and the planar semiconductor member 28 is adjusted so that the total thickness of the two wafers in the composite substrate is substantially equal to the thickness of a standard 200 mm diameter silicon wafer, for example, 750 μm. This is advantageous for subsequent wafer processing steps.

Figure 7:
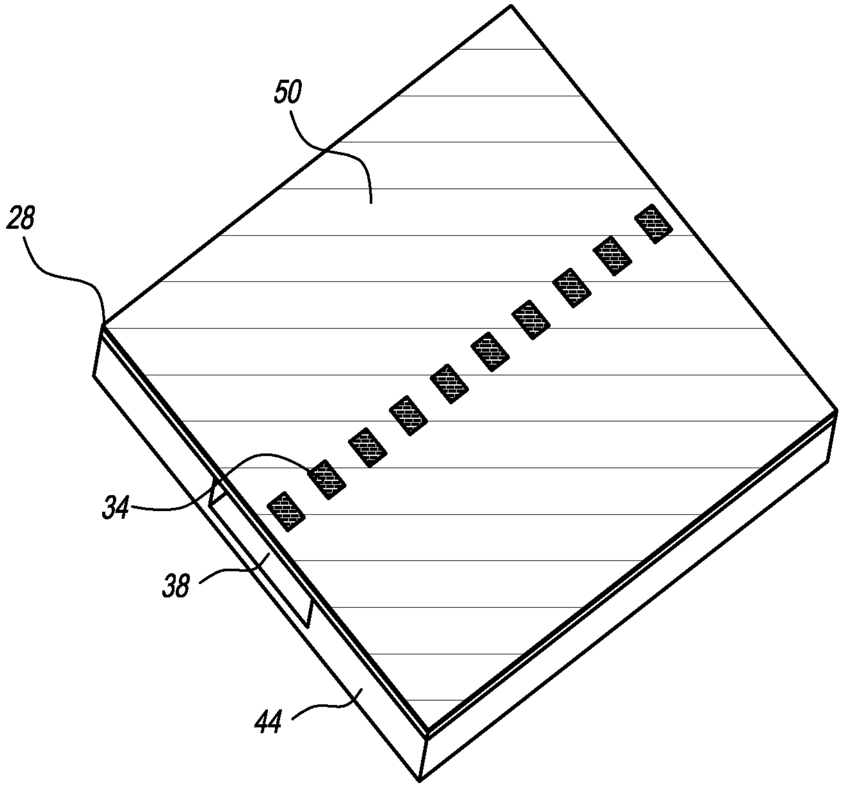
FIG. 7 shows an array of resistive heaters formed on the planar semiconductor member of FIG. 6.

As shown in FIG. 7 and described in box 104 of FIG. 14, an array of drop forming mechanisms, in this case, an array of resistive heaters 34 is formed on top of an insulating dielectric layer 50 which is formed on top of the planar semiconductor member 28 of the composite substrate. Fabricated in the inkjet printhead die 18, but not shown, are electrical connections to the resistive heaters 34, as well as power LDMOS and CMOS logic circuitry to control drop ejection. The insulating dielectric layer 50 can also be deposited during these processes. The fabrication of the heater structure is described for example in copending U.S. patent application Ser. No. 12/143,880 filed Jun. 23, 2008. A difference between the present invention and previous inkjet printheads is that in the present invention an ink passageway (such as channel 38) is formed in a first wafer that is then bonded to a second wafer upon which the drop ejectors and associated electronics are subsequently formed.

Figure 8:
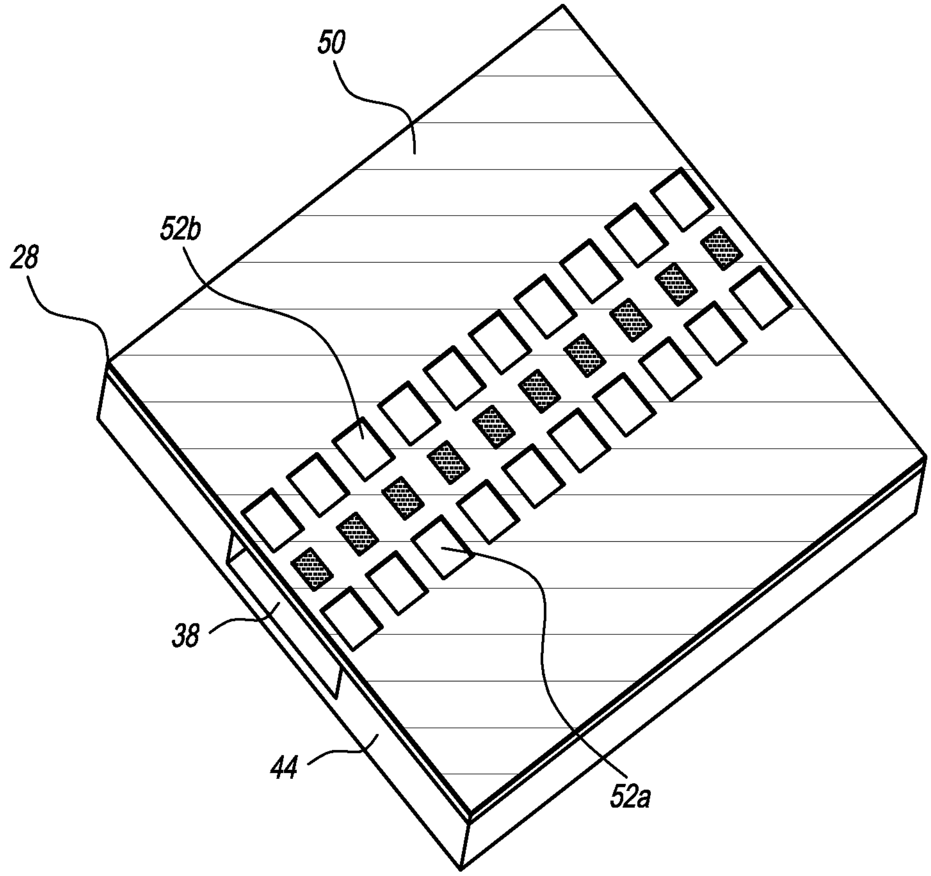
FIG. 8 shows a dielectric layer with feed openings on the planar semiconductor member of FIG. 7.

As shown in FIG. 8 and described in box 106 of FIG. 14, the insulating dielectric layer 50 is patterned and etched through to the planar semiconductor member 28 forming feed openings 52*a* and 52*a*.

Figure 9:
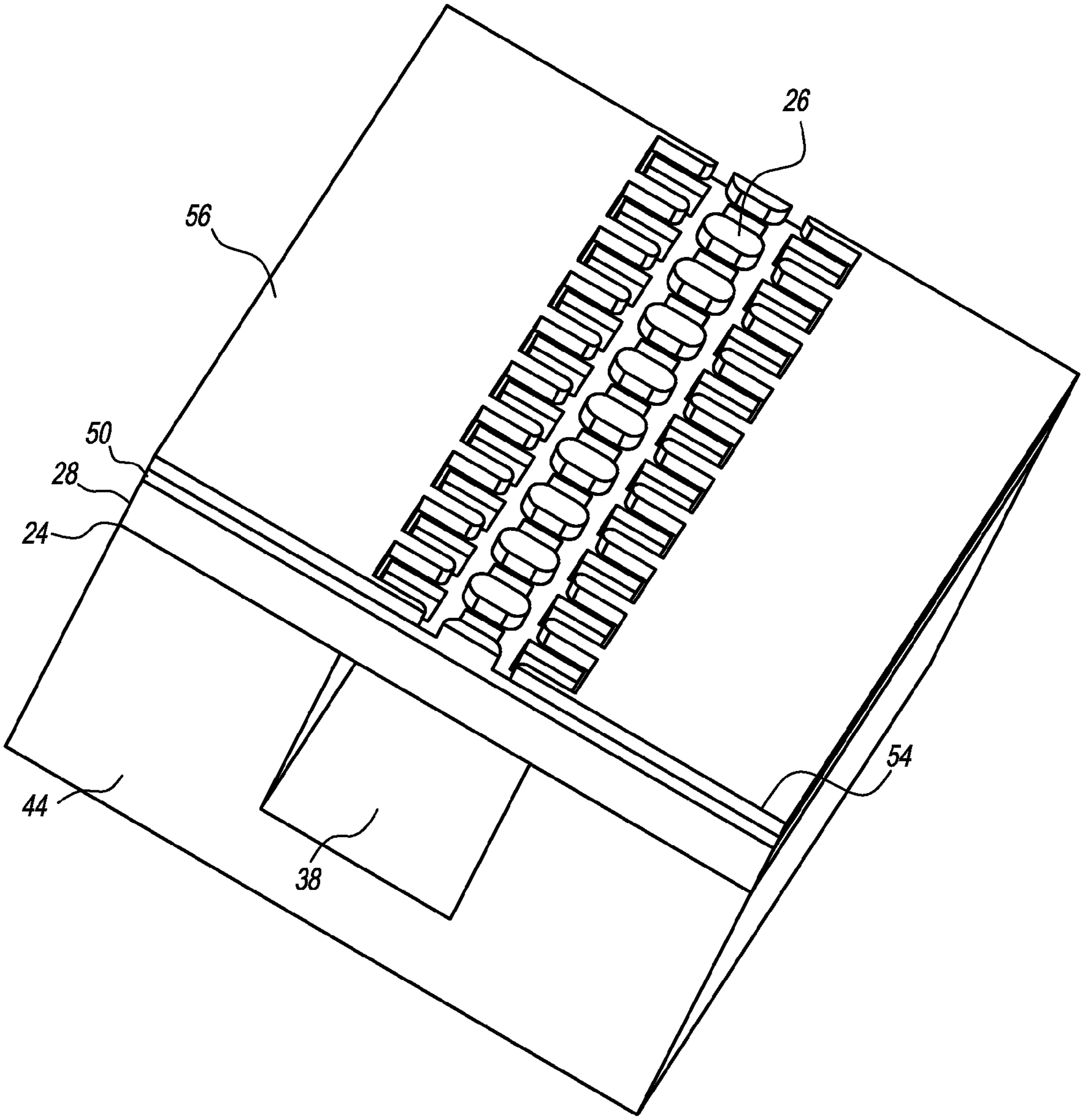
FIG. 9 shows a patterned chamber layer formed on the planar semiconductor member of FIG. 8.

As shown in FIG. 9 and described in box 108 of FIG. 14, a chamber layer 54 is coated and patterned to form chamber walls 26 between adjacent drop ejectors 20, as well as an outer passivation layer 56 that extends over the rest of the inkjet printhead die 18 to protect the circuitry from the ink. The chamber layer 54 can be formed by spin coating, exposure, and development using a photoimageable epoxy such as a novolak resin based epoxy, for example TMMR resist available from Tokyo Ohka Kogyo. The thickness of the chamber layer 54 is typically in the range 8-25 μm.

Figure 10:
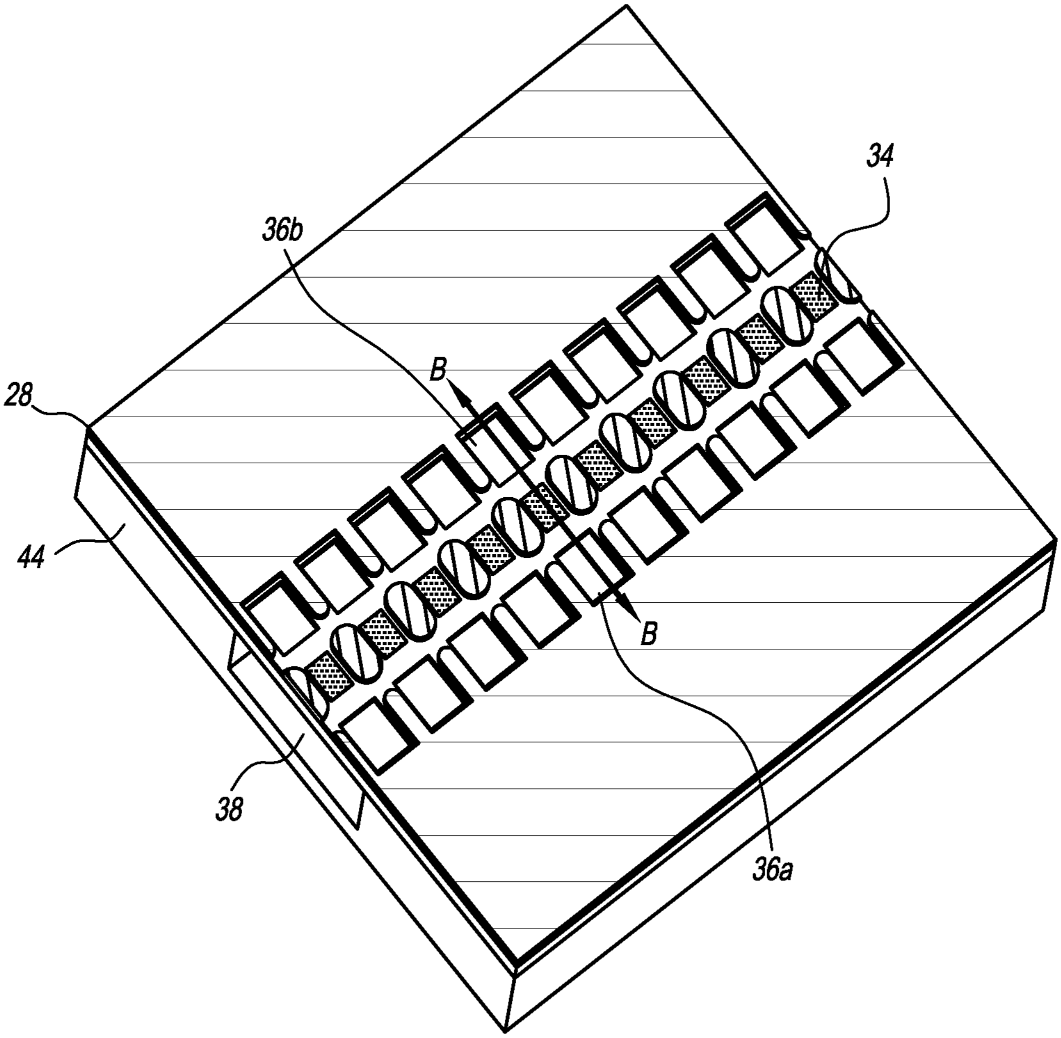
FIG. 10 shows ink feed holes etched through the planar semiconductor member of FIG. 9.
Figure 11:
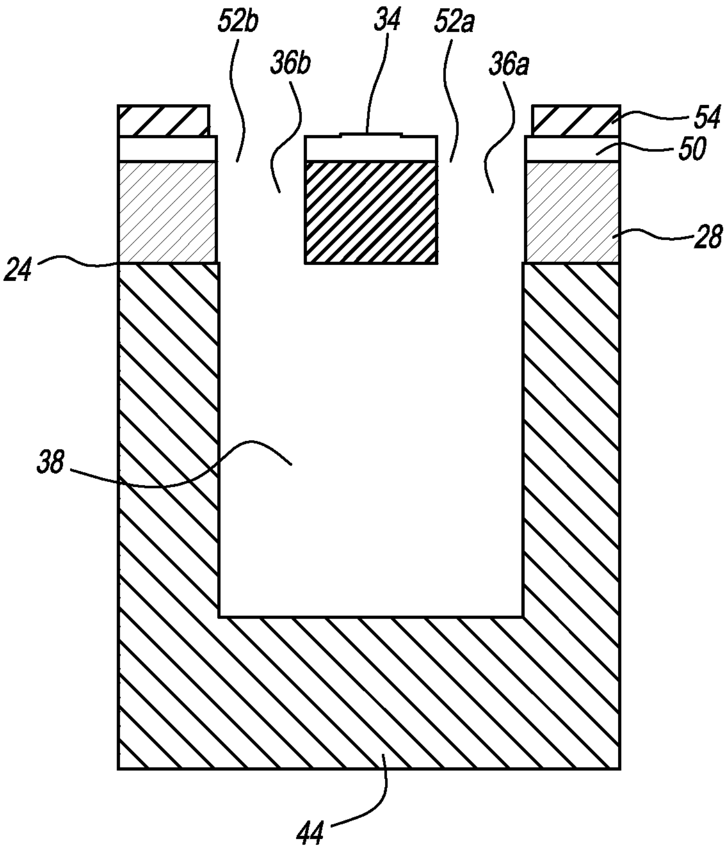
FIG. 11 is a cross-sectional view along line B-B of FIG. 10.

As shown in FIGS. 10 and 11 and described in box 110 of FIG. 14, ink feed holes 36*a*, 36*b* are etched through the planar semiconductor member 28 connecting the drop ejectors 20 with the channel 38 in the planar substrate member 44 at interface 24. The ink feed holes 36 are formed using the feed openings 52*a*, 52*b* as the mask and using anisotropic reactive ion etching of the silicon, as is well known in the art. The cross-sectional view of FIG. 11, taken through line B-B of FIG. 10, shows the ink feed holes 36*a* and 36*b* etched through the planar semiconductor member 28.

Figure 12:
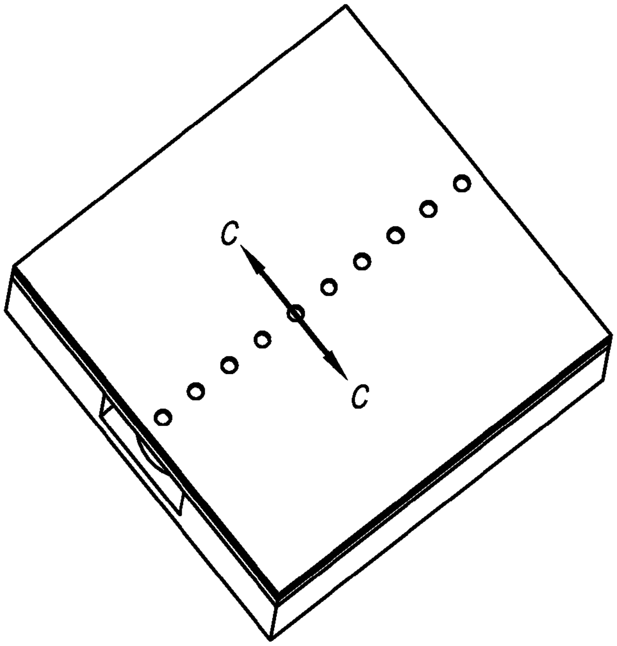
FIG. 12 shows a nozzle plate and nozzles formed on the planar semiconductor member of FIG. 10.
Figure 13:
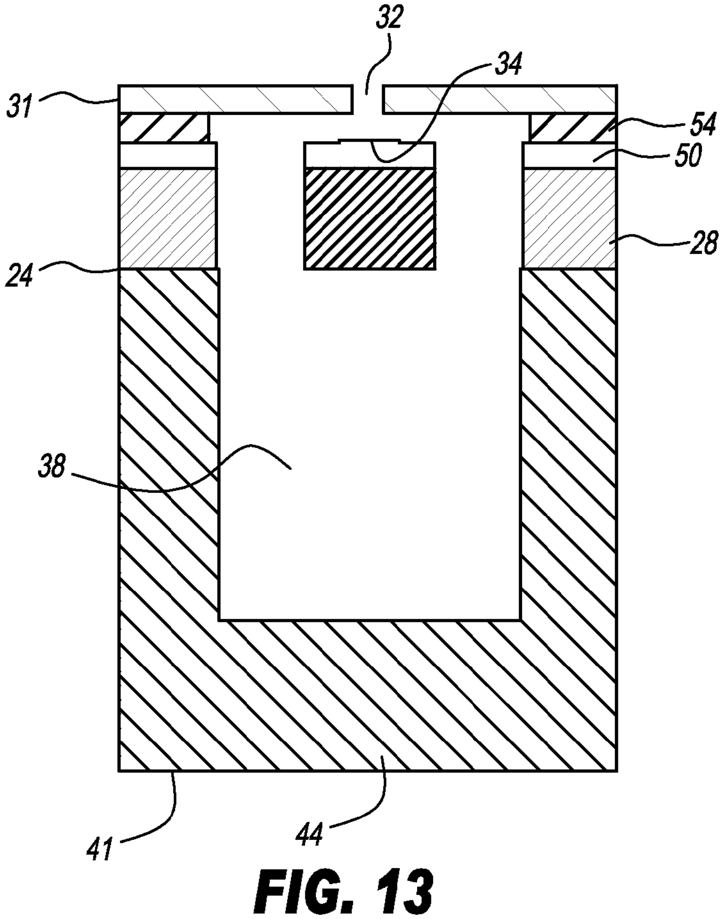
FIG. 13 is a cross-sectional view along line C-C of FIG. 12.

As shown in FIGS. 12 and 13 and described in box 112 of FIG. 14, a photoimageable nozzle plate layer 31 in the form of a dry film resist is laminated, and patterned to form nozzles 32. The photoimageable nozzle plate layer 31 can be formed using a dry film photoimageable epoxy such as a novolak resin based epoxy, for example TMMF dry film resist available from Tokyo Ohka Kogyo. The thickness of the photoimageable nozzle plate layer 31 layer is typically in the range 5-20 μm and in a preferred embodiment is 10 μm. The use of a dry film laminate for the nozzle plate enables the formation of the nozzle plate 31 on the inkjet printhead containing high topography features such as the ink feed holes 36*a*, 36*b*. Up to this point, ink connection hole(s) 40 (shown in FIGS. 2-4) has not yet been formed to connect channel 38 with second surface 41 of planar substrate member 44. As a result, the ink feed openings 36 are not yet connected to the backside (i.e. second surface 41) of the composite substrate, so that there are no difficulties in applying vacuum at second surface 41 to hold down the composite substrate during lamination. The cross-sectional view of FIG. 13, taken through line C-C of FIG. 12, shows the nozzle 32 formed in the nozzle plate material 31 over the resistive heaters 34.

As shown in FIGS. 2 and 3 and described in box 114 of FIG. 14, ink connection holes 40 are opened up from the second surface 41 of the planar substrate member 44 for access to the channel 38 in the planar substrate member 44. Laser drilling or etching of the silicon can form the ink connection holes 40. The diameter of the ink connection hole 40 is nominally the width of the channel 38 but can be larger or smaller. The cross-sectional view of FIG. 3, taken through line A-A of FIG. 2, shows the ink connection hole 40 connecting to the channel 38 of the planar substrate member 44. The ink connection hole 40 is shown in FIG. 2 as circular but can alternatively be rectangular or elliptical. The ink connection hole 40 can also be formed with a plurality of input holes (not shown). For example a particle filter can be formed in the ink connection hole 40 by creating a grid of small openings during the laser drilling or etching process to form ink connection hole 40.

Figure 15:
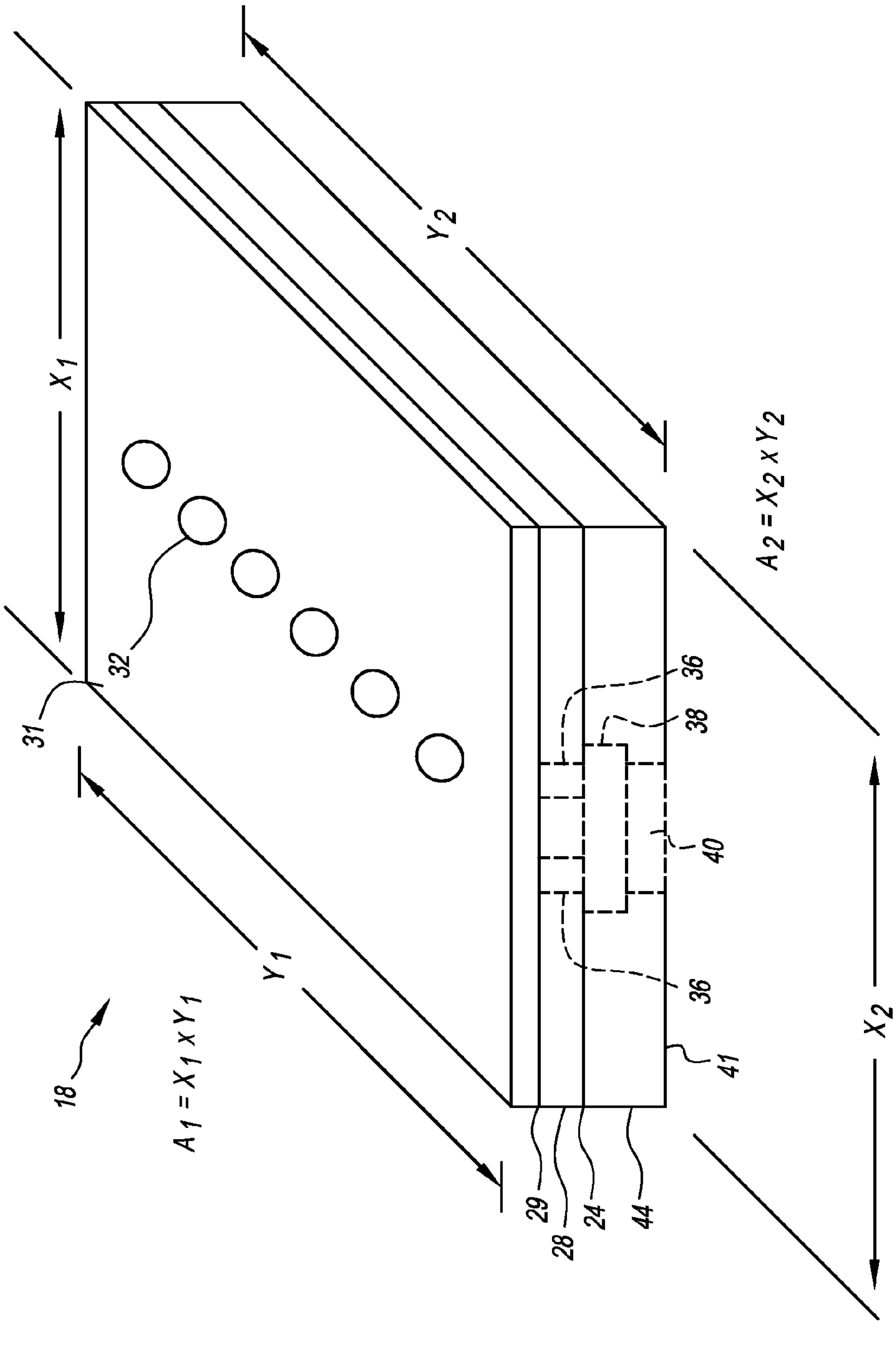
FIG. 15 shows a perspective view of the inkjet printhead die of FIG. 2.

As described in box 116 of FIG. 14 and shown in FIGS. 15 and 16, the composite substrate wafer pair 46 is next diced into a plurality (typically several hundred) individual inkjet printhead die 18. Because the dicing operation cuts the side edges of inkjet printhead die 18 substantially perpendicular to the plane of composite substrate wafer pair 46, the width and length dimensions X and Y respectively of inkjet printhead die 18 are substantially the same for first surface 29 of planar semiconductor member 28 and for second surface 41 of planar substrate member 44. As a result, the area $A_1=X_1 \times Y_1$ of first surface 29 of inkjet printhead die 18 is substantially the same as the area $A_2=X_2 \times Y_2$ of the second surface 41. Because nozzle plate 32 and the other layers on first surface 29 are so thin, $A_1$ can equivalently be regarded as the product of width and length dimensions $X_1$ and $Y_1$ at the visible outer surface of the inkjet printhead die 18 at nozzle plate 31, as shown in FIG. 15. If the dicing cut is tapered, $A_2$ can be slightly different from $A_1$. Similarly if slots are etched into the edges of second surface 41, for example when etching ink connection hole 40, $A_2$ can be different from $A_1$. However, generally $A_1$ and $A_2$ will be the same within 20%. In other words, $0.8<A_2/A_1<1.2$.

Figure 18:
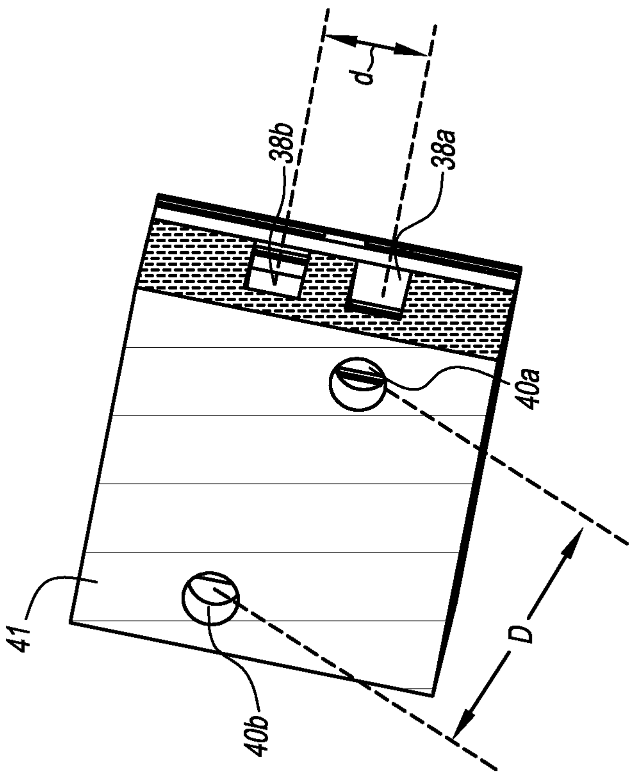
FIG. 18 shows a bottom perspective cut-away view of a portion of the inkjet printhead die of FIG. 17.
Figure 17:
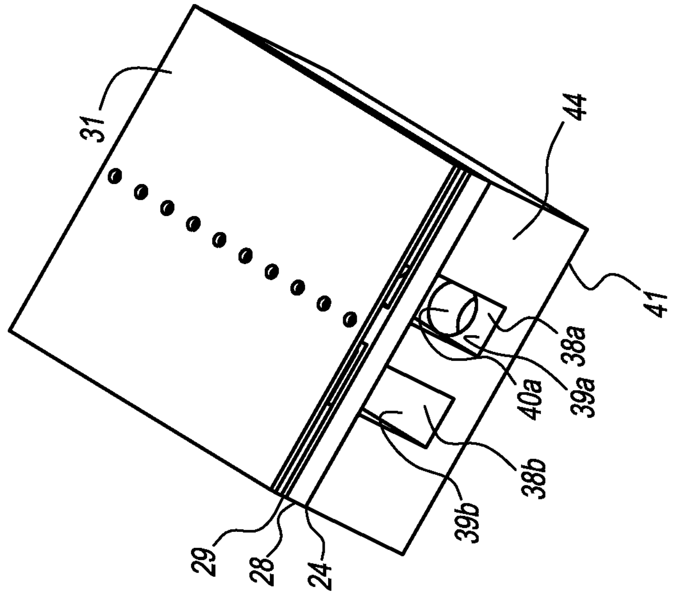
FIG. 17 shows a top perspective cut-away view of a portion of an inkjet printhead die according to a second embodiment of the present invention.

FIGS. 17 and 18 respectively show top and bottom perspective cut-away views (not to scale) of a portion of an inkjet printhead die 18 according to a second embodiment of the present invention. Inkjet printhead die 18 includes a planar semiconductor member 28 and a planar substrate member 44 that are joined together at interface 24 to form a composite substrate. At first surface 29 (opposite interface 24) of planar semiconductor member 28 are a plurality of layers including a nozzle plate 31. In many inkjet printhead die it is advantageous to position drop ejectors ejecting different inks to be positioned close to each other. This is advantageous in making a smaller size multicolor inkjet printhead die or increasing the swath length of the inkjet printhead die without an increase in die area. Examples of this are described in copending U.S. patent application Ser. No. 12/413,729 filed Mar. 30, 2009. However, using conventional fabrication methods, it is difficult to supply ink of one type at a location that is very close to where ink of a different type is supplied, and still provide a reliable seal between passageways and ink connection holes for the two inks.

FIG. 18 shows two ink channels 38*a* and 38*b* having a center-to-center spacing of d, and associated ink connection holes 40*a* and 40*b* respectively. Channels 38*a* and 38*b* have bottoms 39*a* and 39*b* respectively, and ink connection holes 40*a* and 40*b* extend from those respective channel bottoms to second surface 41 of planar substrate 44. Different inks can be supplied to channels 38*a* and 38*b* by connecting different inks at ink connection holes 40*a* and 40*b*. By offsetting the position of the ink connection hole 40*b* relative to ink connection hole 40*a* along the length of the corresponding ink channels 38*a* and 38*b*, the ink connection holes can have a center-to-center spacing D, where D>d. In particular, for making a smaller size multicolor inkjet printhead die 18, it can be advantageous for d to be less than 0.5 mm (for example, between 0.05 mm and 0.5 mm), and for making a reliable ink connection at ink connection holes 40*a* and 40*b*, it can be advantageous for D to be greater than 1 mm (for example between 1 mm and 10 mm).

Figure 19:
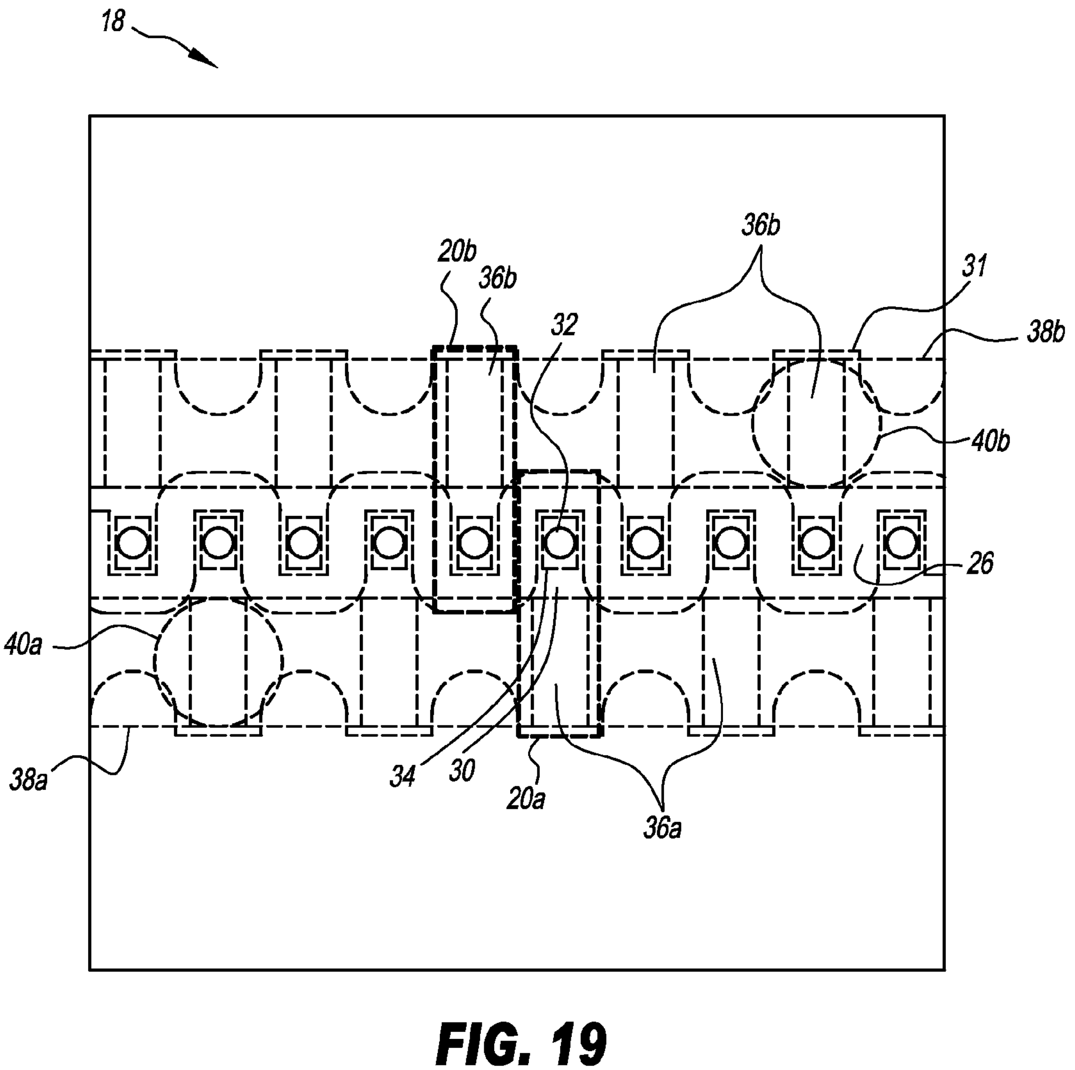
FIG. 19 is a schematic top view of the printhead die of FIG. 17.

Referring to FIG. 19, a schematic representation of a top view of a portion of a drop on demand inkjet printhead die 18 is shown in accordance with the second embodiment of the present invention previously shown in FIGS. 17 and 18. Inkjet printhead die 18 includes an array or plurality of drop ejectors 20, two of which (20*a* and 20*b*) are designated by the heavy dashed line rectangles in FIG. 19 together with their corresponding ink feed holes 36*a* and 36*b*. Drop ejectors 20 include walls 26, extending upwardly toward nozzle plate 31, thereby defining a chamber 30. Walls 26 also separate and isolate adjacent drop ejectors 20*a* and 20*b*) in the array designed to eject different inks. In the example of FIG. 19, the drop ejectors for ejecting different inks are arranged in a single straight line, and walls 26 are formed as a serpentine wall structure. In other examples (not shown), drop ejectors 20*a* for ejecting one ink can be arranged in a line that is parallel to a line of drop ejectors 20*b* for ejecting a different ink. Each chamber 30 includes a nozzle orifice 32 in nozzle plate 31 through which liquid is ejected. A drop forming mechanism, for example, a resistive heater 34 is also located in each chamber 30. In FIG. 19, the resistive heater 34 is positioned above the top surface of planar semiconductor member 28 in the bottom of chamber 30 and opposite nozzle orifice 32, although other configurations are permitted. In other words, in this embodiment the bottom surface of chamber 30 is above the first surface 29 of planar semiconductor member 28, and the top surface of the chamber 30 is the nozzle plate 31.

Referring to FIG. 19, the ink feed holes include two linear arrays of ink feed holes 36*a* and 36*b* that supply ink to the chambers 30. Ink feed holes 36*a* are positioned on a first side of the nozzle array adjacent drop ejectors 20*a* and ink feed holes 36*b* are positioned on an opposite side of the nozzle array adjacent drop ejectors 20*b*, each drop ejector containing a chamber 30 and nozzle orifice 32. Ink feed holes 36*a* can be fluidically connected to one another by channel 38*a*, but ink feed holes 36*a* are not fluidically connected to ink feed holes 36*b* in this embodiment. Drop ejectors 20 are formed at a high nozzle per inch count. In a preferred embodiment of the present invention the drop ejectors 20 are spaced with a period of 20-80 μm. The length of feed holes 36 can vary from 10 μm to 100 μm, depending on the design. The width of the feed-holes 36 also can vary similarly from 10 μm to 100 μm.

FIGS. 20-28 illustrates a fabrication method of the second embodiment of the present invention forming an inkjet printhead die 18 containing closely spaced separate ink channels for providing two different inks to be ejected from closely spaced sets of nozzles. Although the geometries and functions of the inkjet printhead die 18 of the second embodiment differ from that of the first embodiment, the flow chart of FIG. 14 can be used to summarize a sequence of fabrication steps.

Figure 20:
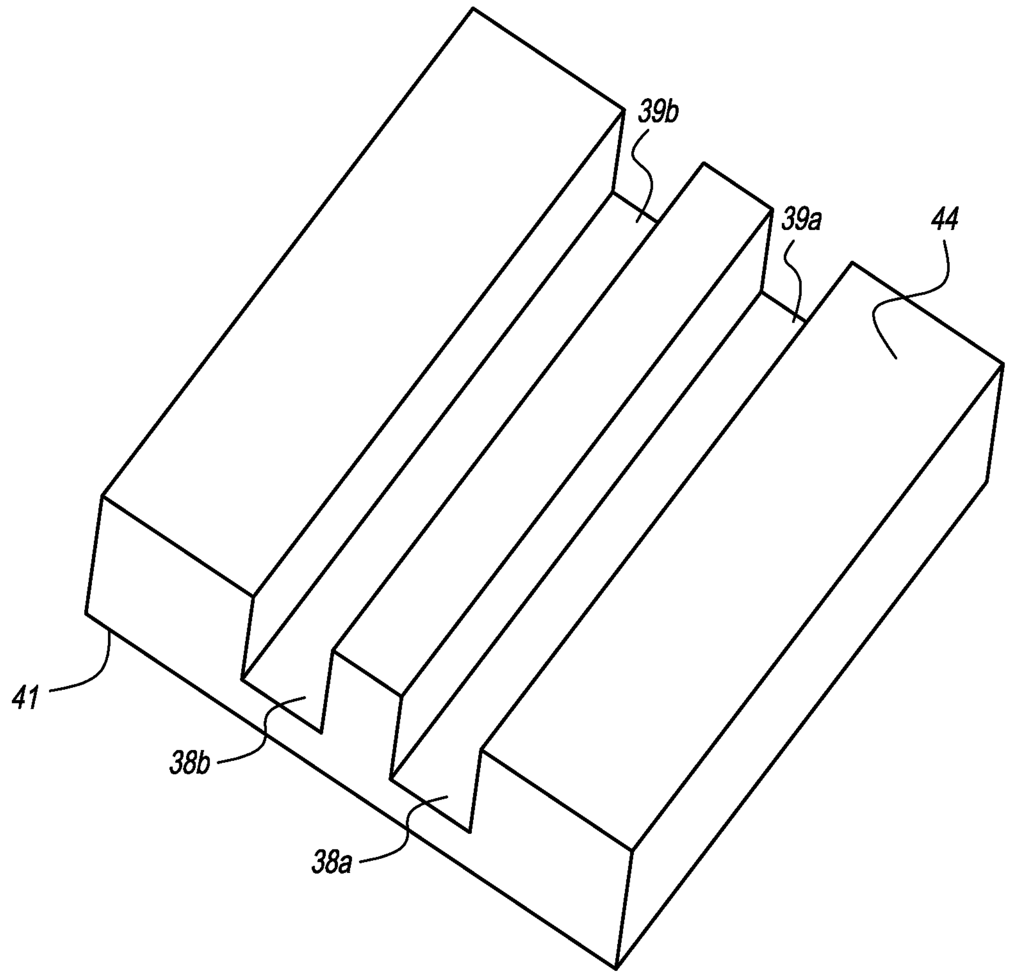
FIG. 20 is a top perspective view of a planar substrate member portion of the printhead die of FIG. 17.

As shown in FIG. 20 and described in box 100 of FIG. 14 a planar substrate member 44 is patterned and two channels 38*a* and 38*b* are etched into a surface, which will subsequently be located at interface 24 (with reference to FIG. 17. The planar substrate member 44 is a silicon wafer in the thickness range 300-μm-1 mm with a preferred thickness range of 650-725 μm. Channels 38*a* and 38*b* are formed by lithographic patterning and deep reactive ion etching of the silicon, as is well known in the art. The depth of channels 38*a* and 38*b* is less than the thickness of the planar substrate member 44 and is in the range 300-900 μm with a preferred depth of 400-450 μm. As a result, channels 38*a* and 38*b* have bottoms 39*a* and 39*b* respectively and do not extend all the way through to second surface 41.

Figure 21:
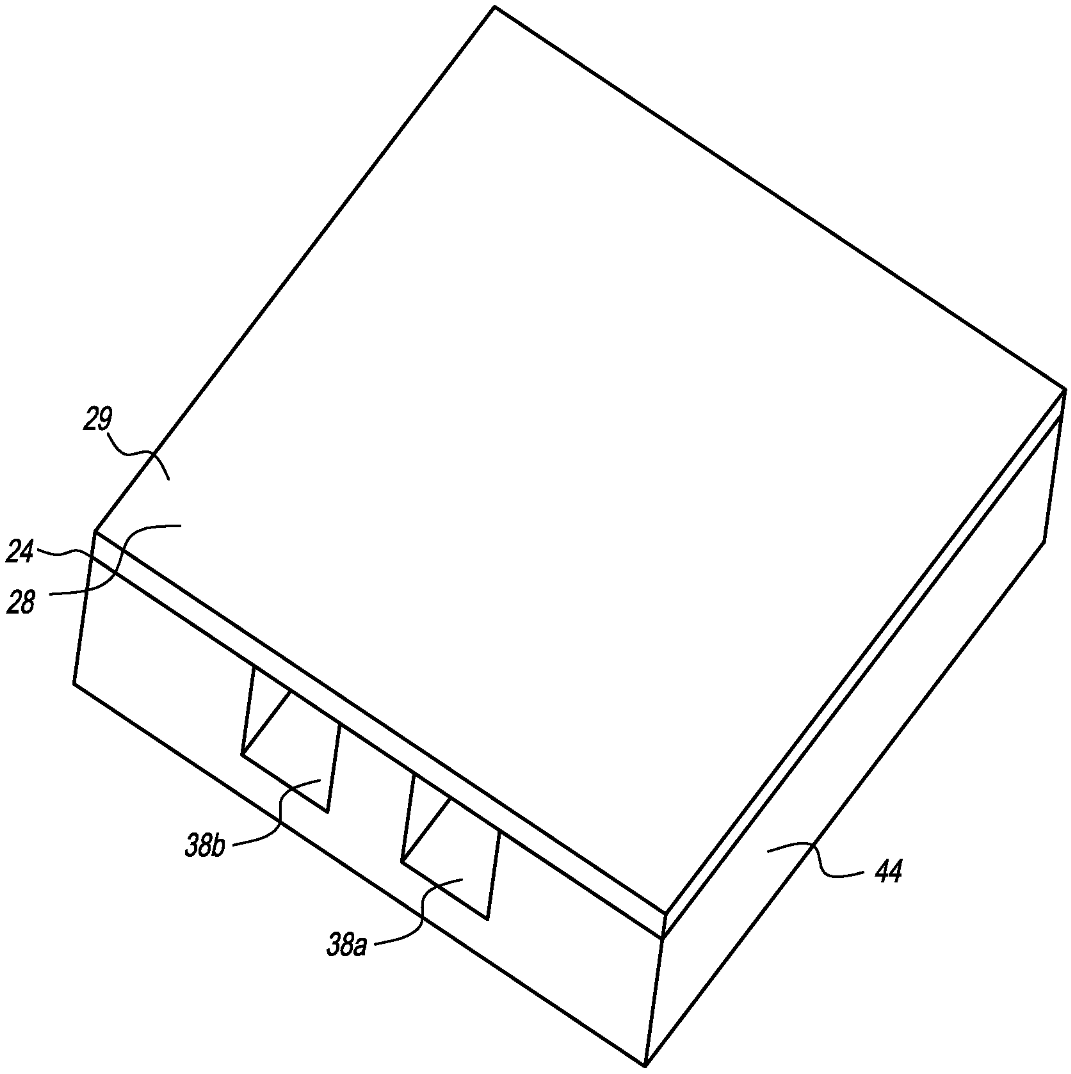
FIG. 21 is a top perspective view of a planar semiconductor member bonded to the planar substrate member of FIG. 20.

As shown in FIG. 21 and described in box 102 of FIG. 14 a planar semiconductor member 28 (e.g. a silicon wafer) is bonded to the planar substrate member 44 at interface 24 to form a composite substrate wafer pair. The bonding of the two wafers can be done by high temperature fusion bonding of the two surfaces at interface 24. Prior to bonding a thermal oxide can be formed on the planar substrate member 44 and for planar semiconductor member 28. The bonded planar semiconductor member 28 can be of any initial thickness and then thinned after the bonding step. FIG. 21 shows the planar semiconductor member after the thinning process, where the thickness of the planar semiconductor member is in the range 50-400 μm with a preferred thickness of 50-100 m. First surface 29 of planar semiconductor member 28 is the top surface after the thinning process, and is thus less than 200 μm from the interface 24 in a preferred embodiment. In a preferred embodiment the thickness of the planar substrate member 44 and planar semiconductor member 28 is adjusted so that the total thickness of the two wafers is substantially equal to the thickness of a standard 200 mm diameter silicon wafer, for example, 750 μm. This is advantageous for subsequent wafer processing steps.

Figure 22:
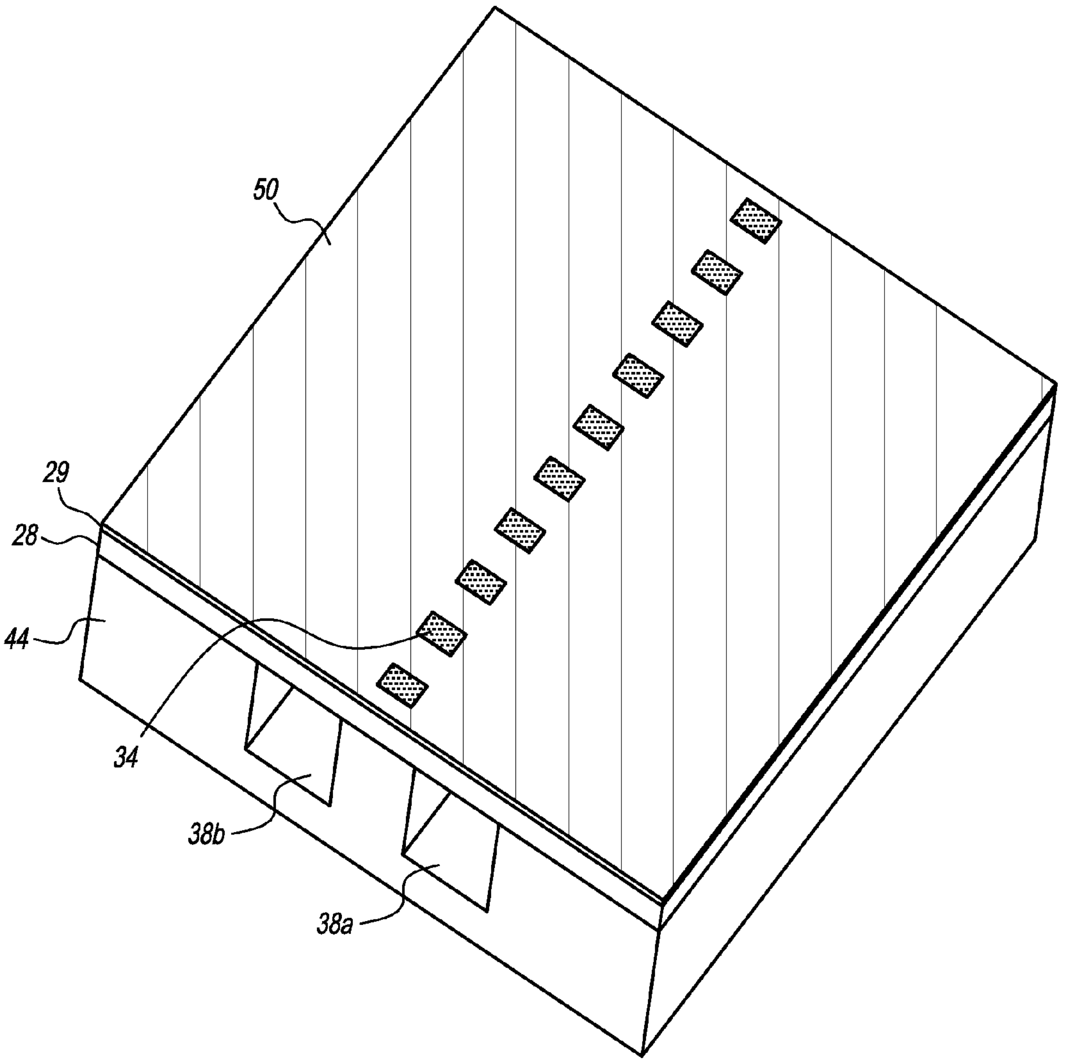
FIG. 22 shows an array of resistive heaters formed on the planar semiconductor member of FIG. 21.

As shown in FIG. 22 and described in box 104 of FIG. 14, an array of drop forming mechanisms, in this case, an array of resistive heaters 34 are formed on top of an insulating dielectric layer 50 which is formed on top of the planar semiconductor member 28 at first surface 29. Fabricated in the inkjet printhead die 18, but not shown, are electrical connections to the resistive heaters 34, as well as power LDMOS and CMOS logic circuitry to control drop ejection. The insulating dielectric layer 50 can also be deposited during these processes. The fabrication of the heater structure is described for example in copending application U.S. Ser. No. 12/143,880.

Figure 23:
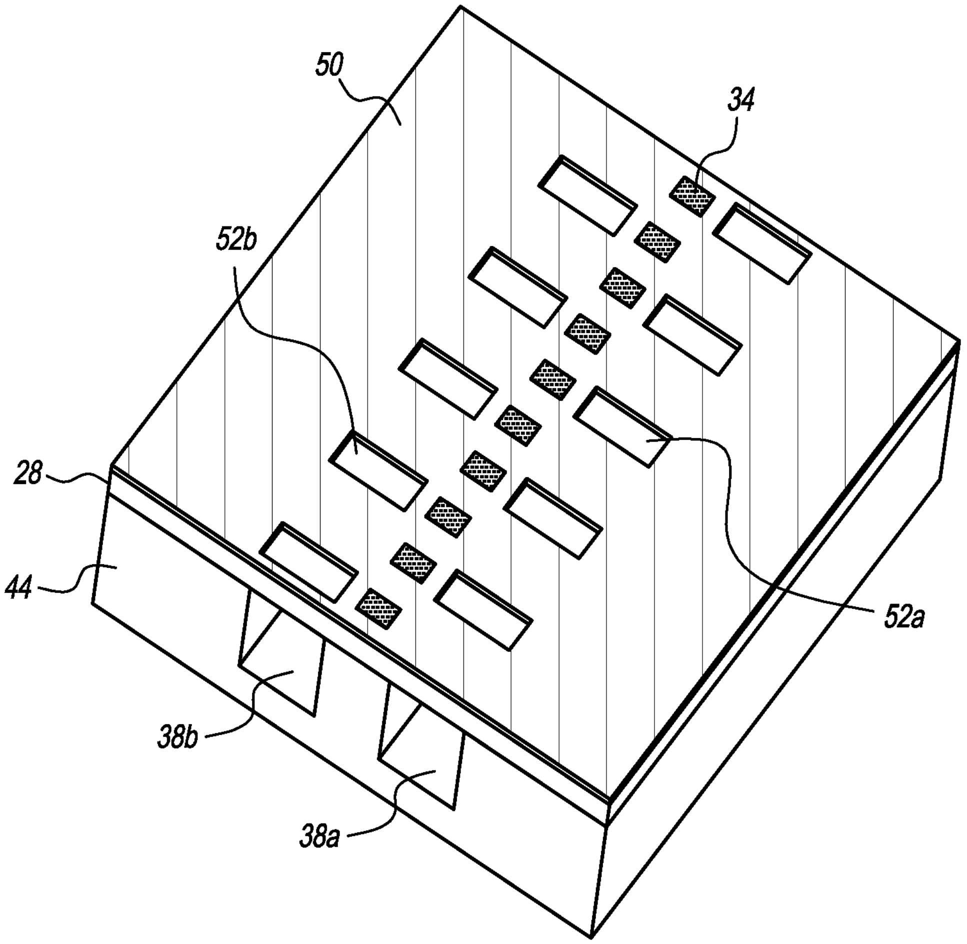
FIG. 23 shows a dielectric layer with feed openings on the planar semiconductor member of FIG. 22.

As shown in FIG. 23 and described in box 106 of FIG. 14, the insulating dielectric layer 50 is patterned and etched through to the planar semiconductor member 28 forming feed openings 52*a* and 52*b*.

Figure 24:
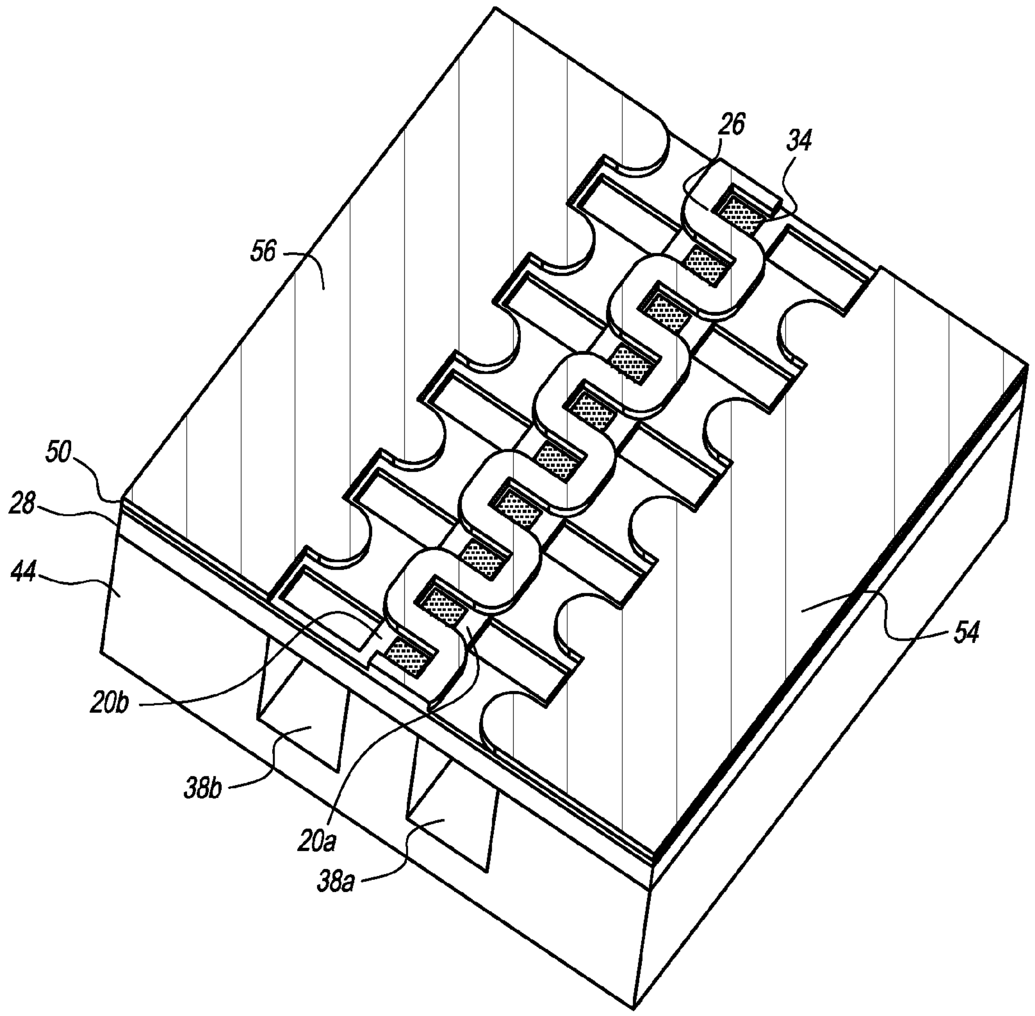
FIG. 24 shows a patterned chamber layer formed on the planar semiconductor member of FIG. 23.

As shown in FIG. 24 and described in box 108 of FIG. 14, a chamber layer 54 is coated and patterned to form chamber walls 26 between adjacent drop ejectors 20, as well as an outer passivation layer 56 that extends over the rest of the inkjet printhead die 18 to protect the circuitry from the ink. The chamber walls 26 are patterned such that drop ejectors 20*a* and 20*b* are fluidically separated from each other, so that the different inks to be ejected by drop ejectors 20*a* and 20*b* are not mixed together. The chamber layer 54 can be formed by spin coating, exposure, and development using a photoimageable epoxy such as a novolak resin based epoxy for example TMMR resist available from Tokyo Ohka Kogyo. The thickness of the chamber layer 54 is in the range 8-25 μm.

Figure 26:
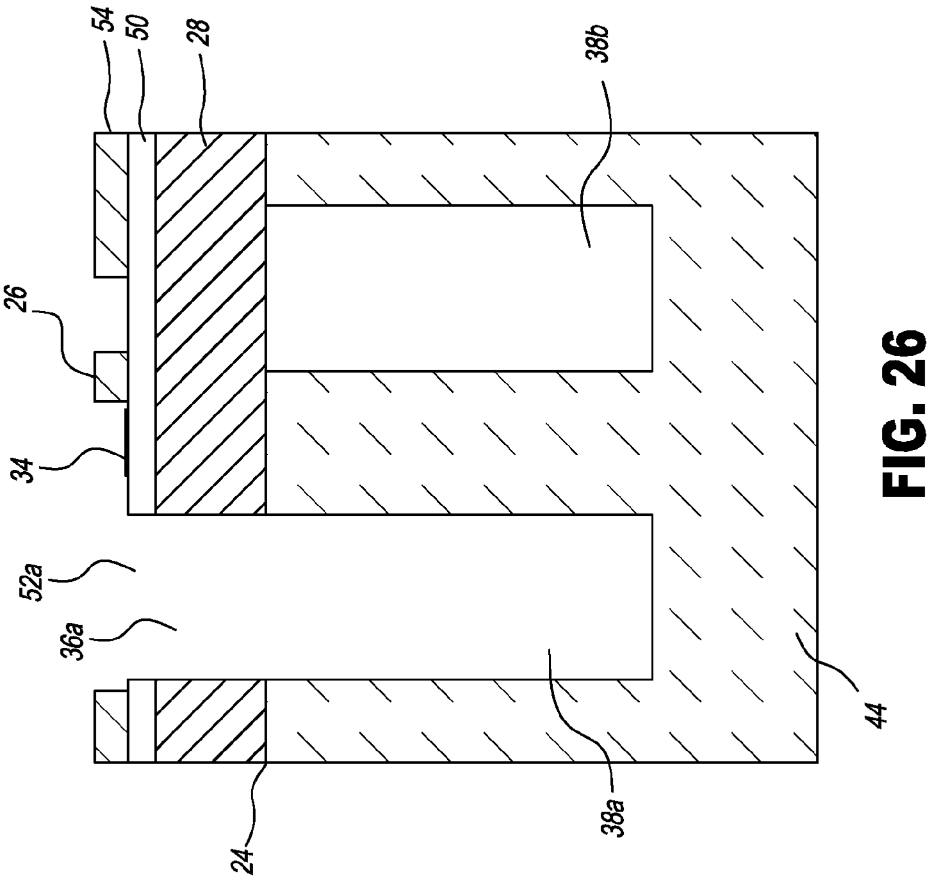
FIG. 26 is a cross-sectional view along line D-D of FIG. 25.
Figure 25:
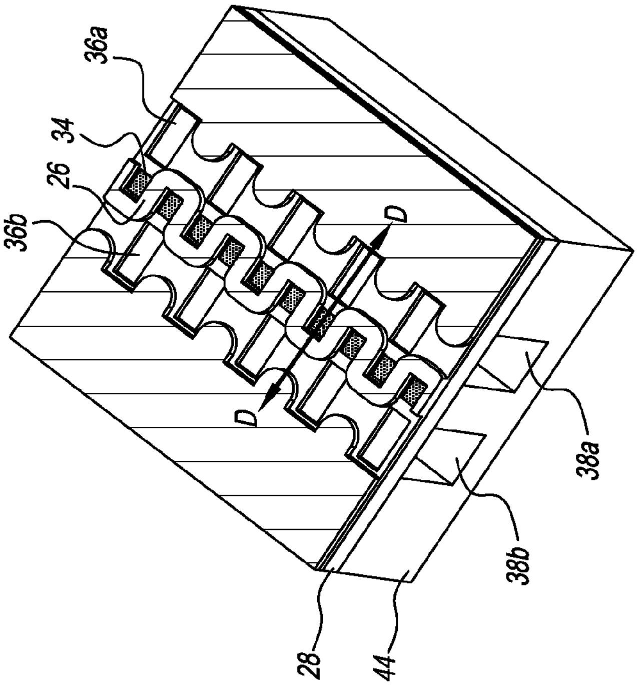
FIG. 25 shows ink feed holes etched through the planar semiconductor member of FIG. 24.

As shown in FIGS. 25 and 26 and described in box 110 of FIG. 14, ink feed holes 36*a* and 36*b* are etched through the planar semiconductor member 28 connecting drop ejectors 20*a*,20*b* with the respective channels 38*a*,38*b* in planar substrate member 44. In other words, channel 38*a* is fluidically connected to ink feed hole 36*a*, and channel 38*b* is fluidically connected to ink feed hole 36*b* at interface 24. The ink feed holes 36 are formed using the feed openings 52 as the mask and using anisotropic reactive ion etching of the silicon, as is well known in the art. The cross-sectional view of FIG. 26, taken through line D-D of FIG. 25 shows the ink feed hole 36*a* etched through the planar semiconductor member 28. Line D-D does not pass through ink feed hole 36*b*.

Figure 28:
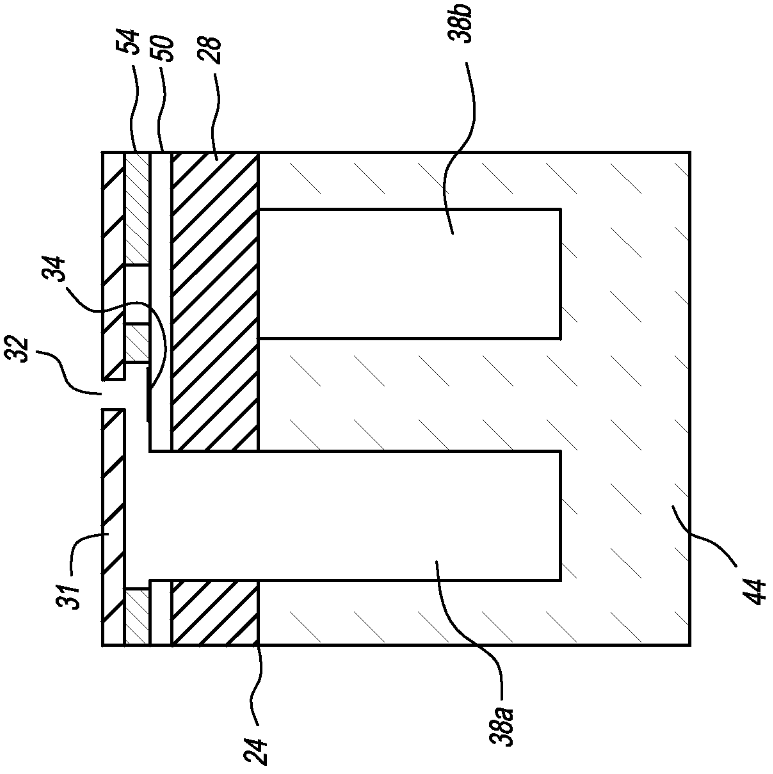
FIG. 28 is a cross-sectional view along line E-E of FIG. 27.
Figure 27:
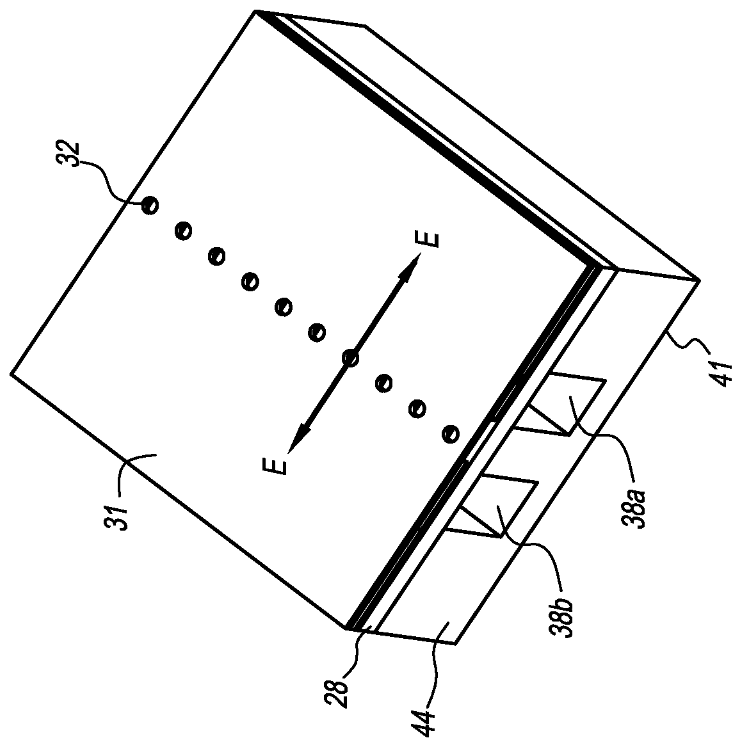
FIG. 27 shows a nozzle plate and nozzles formed on the planar semiconductor member of FIG. 26.

As shown in FIGS. 27 and 28 and described in box 112 of FIG. 14, a photoimageable nozzle plate layer 31 in the form of a dry film resist is laminated, and patterned to form nozzles 32. The photoimageable nozzle plate layer 31 can be formed using a dry film photoimageable epoxy such as a novolak resin based epoxy for example TMMF dry film resist available from Tokyo Ohka Kogyo. The thickness of the photoimageable nozzle plate layer 31 layer is typically in the range 5-25 μm and in a preferred embodiment is 10 μm. The use of a dry film laminate for the nozzle plate enables the formation of the nozzle plate 31 on the inkjet printhead die containing high topography features such as the ink feed holes 36*a*,36*b*. Up to this point, ink connection holes 40*a* and 40*b* (shown in FIGS. 18-19) have not yet been formed to connect channels 38*a* and 38*b* with second surface 41 of planar substrate member 44. As a result, the ink feed openings 36*a* and 36*b* are not yet connected to the backside (i.e. second surface 41) of the composite substrate, so that there are no difficulties in applying vacuum at second surface 41 to hold down the composite substrate during lamination. The cross-sectional view of FIG. 26, taken through line E-E of FIG. 27, shows the nozzle 32 formed in the nozzle plate material 31 over the resistive heaters 34.

As shown in FIGS. 17 and 18 and described in box 114 of FIG. 14, ink connection holes 40*a*,40*b* are opened up from the back of the planar substrate member 44 for access to respective channels 38*a*,38*b* in the planar substrate member 44. Laser drilling or etching of the silicon can form the ink connection holes 40*a*,40*b*. The diameter of the ink connection hole is nominally the width of the channels 38*a*,38*b* but can be larger or smaller. FIG. 18 shows the bottom of the planar substrate member 44 with two ink connection holes 40*a*,40*b* connecting to channels 38*a*,38*b* of the planar substrate member 44. The ink connection holes 40*a*,40*b* are shown in FIG. 18 as circular but can also be rectangular or elliptical. FIG. 18 shows only a portion of the inkjet printhead die 18. Along the entire printhead die there can be multiple ink connection holes. In addition, for inkjet printhead die including drop ejectors for more than two different inks, there can be channels, ink connection holes and ink feed holes corresponding to each different ink.

As described in box 116 of FIG. 14 and shown in FIGS. 15 and 16, the composite substrate wafer pair 46 is next diced into a plurality (typically several hundred) individual inkjet printhead die 18. As discussed above relative to FIG. 15, because the dicing operation cuts the side edges of inkjet printhead die 18 substantially perpendicular to the plane of composite substrate wafer pair 46, the width and length dimensions X and Y respectively of inkjet printhead die 18 are substantially the same for first surface 29 of planar semiconductor member 28 and for second surface 41 of planar substrate member 44.

Figure 29:
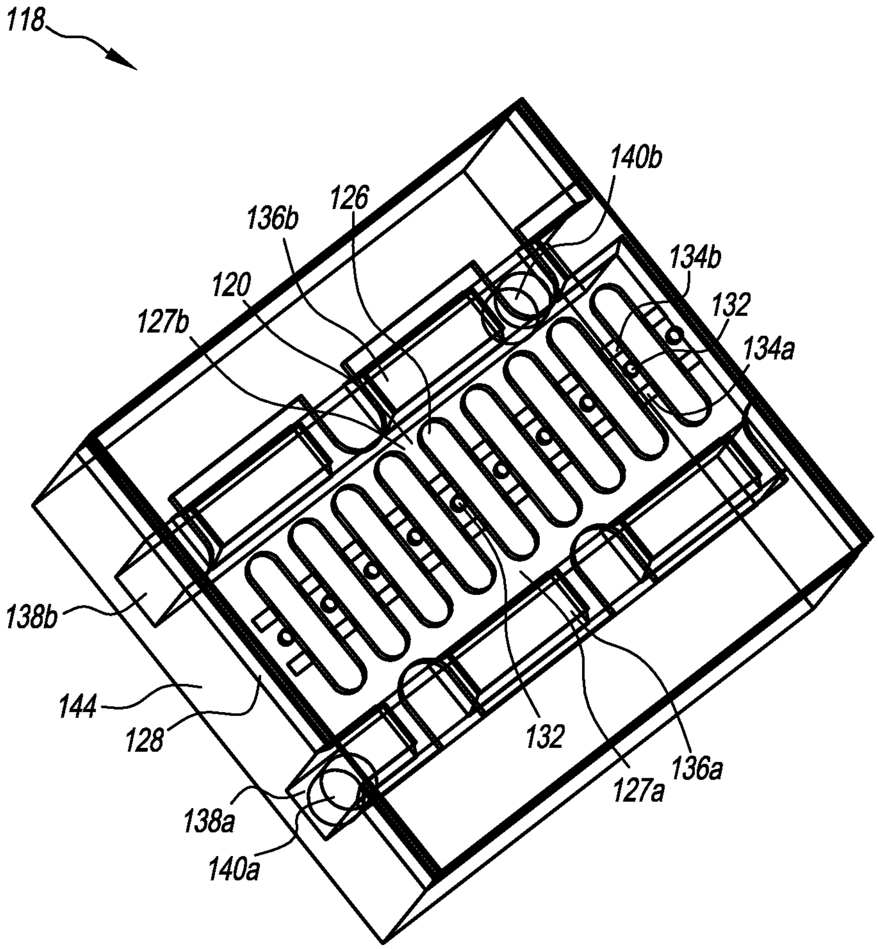
FIG. 29 schematic representation of a partial section of a continuous inkjet printhead die according to a third embodiment of the present invention.

Referring to FIG. 29, a schematic representation of a partial section of a continuous inkjet printhead die 118 is shown in accordance with a third embodiment of the present invention. Continuous inkjet printhead die 118 includes an array or plurality of pressurized liquid ejectors 120. Walls 126 separate the pressurized liquid ejectors 120. The walls 126 also define entrance paths 127*a*,127*b* on each side of a nozzle orifice 132 through which a pressurized stream of liquid is ejected. To break the stream into drops, resistive heaters 134*a*, 134*b* are also located within the entrance paths 127*a*,127*b*. In an alternative configuration a single resistive heater is positioned directly below the nozzle orifice 132.

Referring to FIG. 29, the feed holes comprise two linear arrays of feed holes 136*a* and 136*b* formed in a planar semiconductor member 128. Pressurized liquid flows from feed holes 136*a*,136*b* located on opposite sides of liquid ejectors 120, through the entrance paths 127*a*,127*b*, to form a single stream flowing out of nozzle orifice 132. Fluidically connected to the feed holes 136*a*,136*b* are channels 138*a*,138*b* respectively, formed in a planar substrate member 144. In the back of this planar substrate member are liquid connection holes 140*a*,140*b* that connect to liquid sources (not shown) supplying the liquid to the liquid ejectors 120. If liquid connection hole 140*a* is positively pressurized relative to liquid connection hole 140*b*, a cross-flow will be set up in the direction of the heavy arrows in FIG. 29 to clean debris from the entrance paths 127*a*,127*b*.

FIGS. 30-37 illustrate a fabrication method of the third embodiment of the present invention for forming a continuous inkjet printhead die 118 utilizing multiple ink channels for cross-flow cleaning capabilities. Although the geometries and functions of the continuous inkjet printhead die 118 of the third embodiment differ from that of the first and second embodiments, the flow chart of FIG. 14 can be used to summarize a sequence of fabrication steps.

Figure 30:
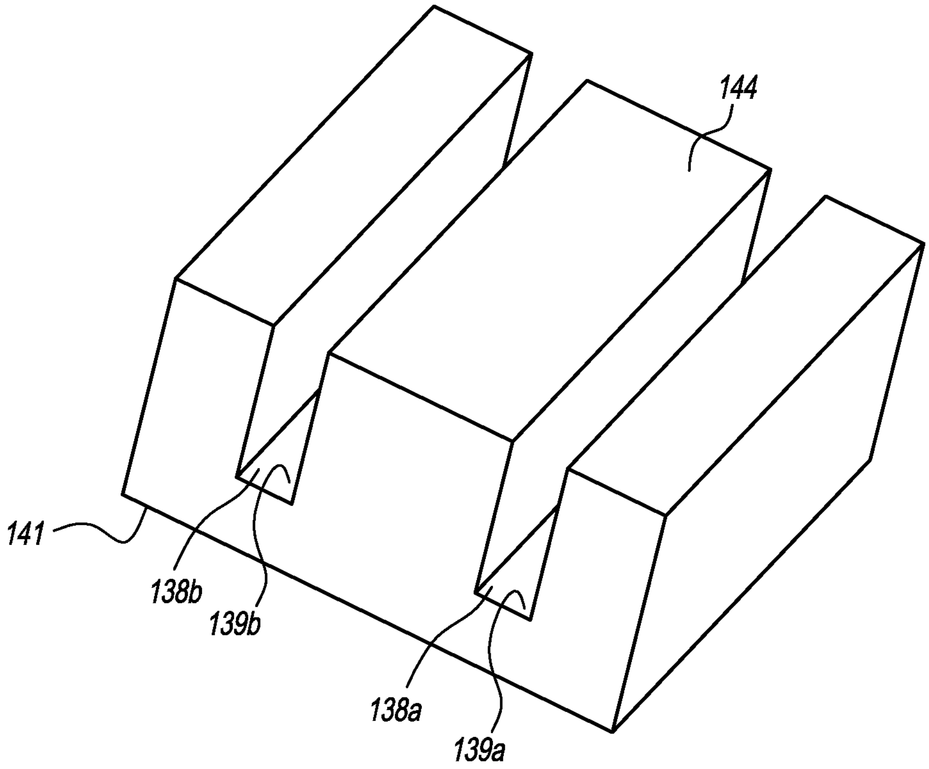
FIG. 30 is a top perspective view of a planar substrate member portion of the printhead die of FIG. 29.

As shown in FIG. 30 and described in box 100 of FIG. 14 a planar substrate member 144, is patterned and channels 138*a*,138*b* are etched into the planar substrate member 144. The planar substrate member 144 is a silicon wafer in the thickness range 300-μm-1 mm with a preferred thickness range of 650-725 μm. The channels 138*a*,138*b* are formed by lithographic patterning and deep reactive ion etching of the silicon, as is well known in the art. The depth of the channels 138*a*,138*b* is less than the thickness of the planar substrate member 44 and is in the range 300-900 μm with a preferred depth of 400-450 μm. As a result, channels 138*a* and 138*b* have bottoms 139*a* and 139*b* respectively and do not extend all the way through to second surface 141.

Figure 31:
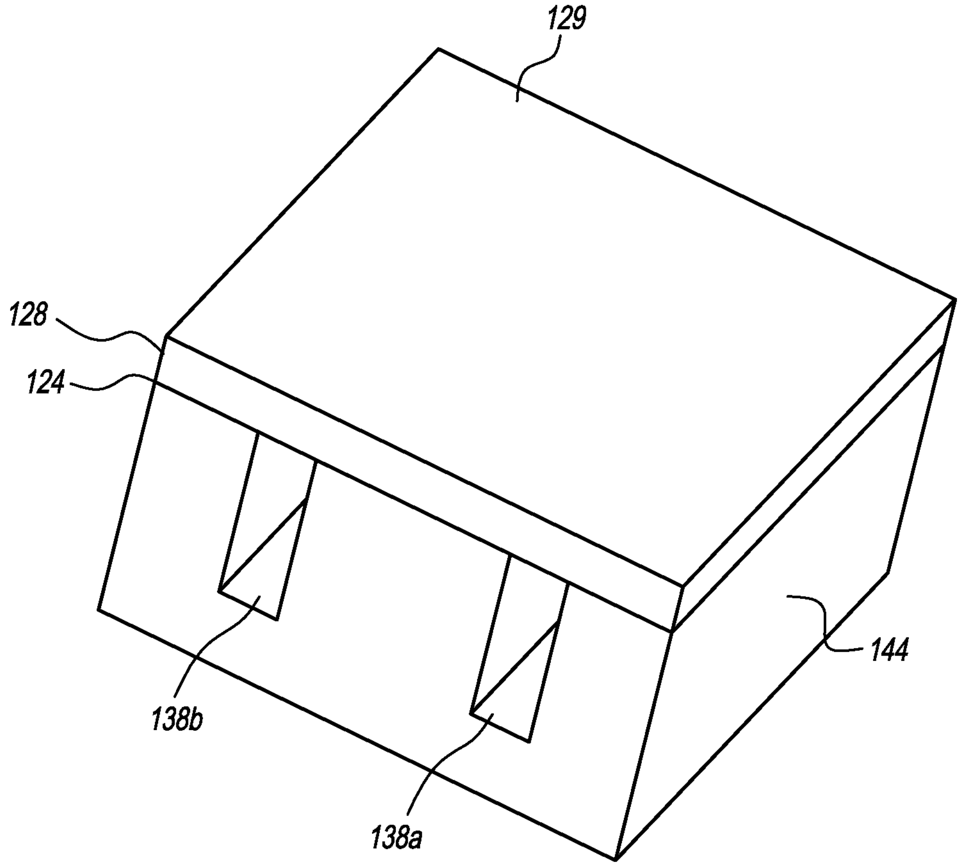
FIG. 31 is a top perspective view of a planar semiconductor member bonded to the planar substrate member of FIG. 30.

As shown in FIG. 31 and described in box 102 of FIG. 14 a planar semiconductor member 128 (e.g. a silicon wafer) is bonded to the planar substrate member 144 at interface 124 to form a composite substrate wafer pair. The bonding of the two wafer can be done by high temperature fusion bonding of the two surfaces at interface 124. Prior to bonding, a thermal oxide can be formed on planar substrate member 144 and/or planar semiconductor member 128. The bonded planar semiconductor member 128 can be of any initial thickness and then thinned after the bonding step. FIG. 31 shows the planar semiconductor member 128 after the thinning process, where the thickness of the planar semiconductor member 128 is in the range 50-400 μm with a preferred thickness of 50-100 μm. First surface 129 of planar semiconductor member 128 is the top surface after the thinning process, and is thus less than 200 μm from the interface 124 in a preferred embodiment. In a preferred embodiment the thickness of the planar substrate member 144 and the planar semiconductor member 128 is adjusted so that the total thickness of the two wafers is equal to the thickness of a standard 200 mm diameter silicon wafer, for example, 750 μm. This is advantageous for subsequent wafer processing steps.

Figure 32:
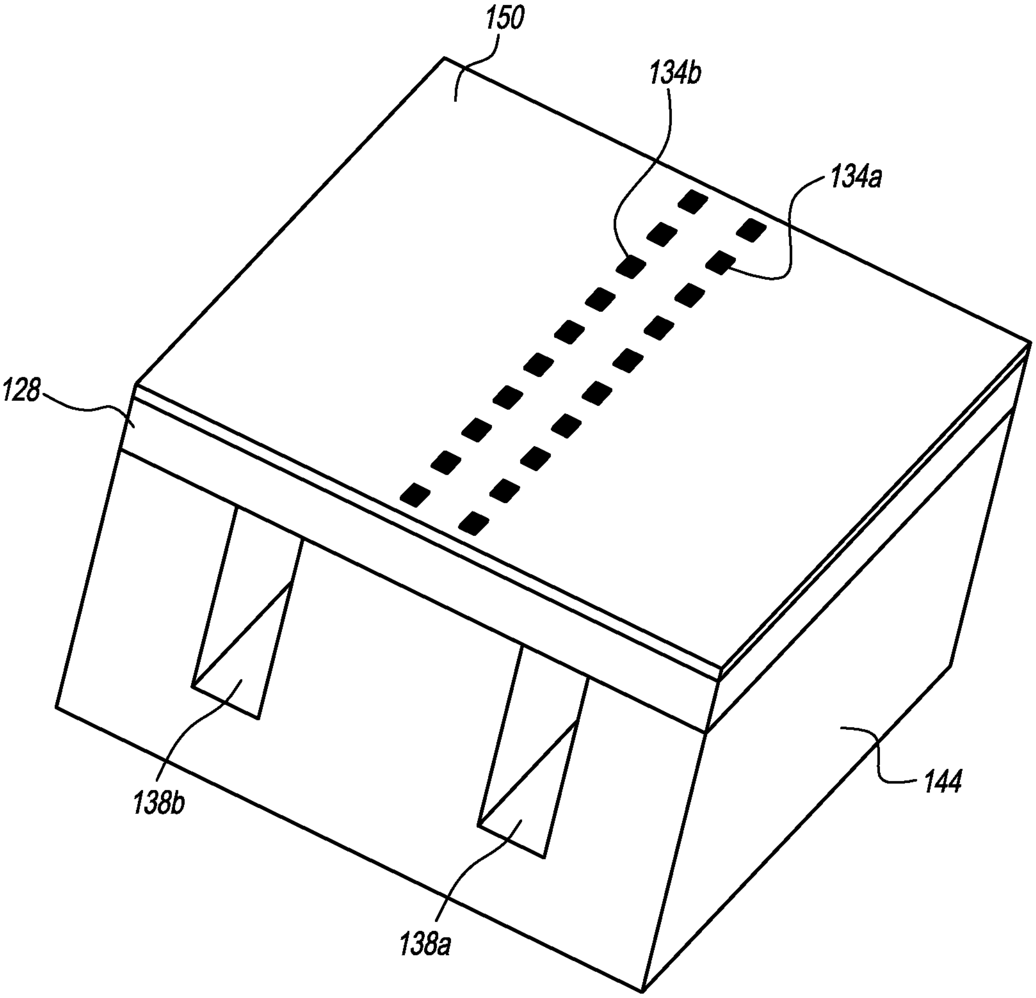
FIG. 32 shows an array of resistive heaters formed on the planar semiconductor member of FIG. 31.

As shown in FIG. 32 and described in box 104 of FIG. 14, a drop break-off mechanism, in this case, an array of resistive heaters 134*a*,134*b* are formed on top of an insulating dielectric layer 150 which is formed on top of the planar semiconductor member 128. Fabricated in the continuous inkjet printhead 118, but not shown, are electrical connections to the resistive heaters 134*a*,134*b*, as well as power LDMOS and CMOS logic circuitry to control drop break-off. The insulating dielectric layer 150 can also be deposited during these processes.

Figure 33:
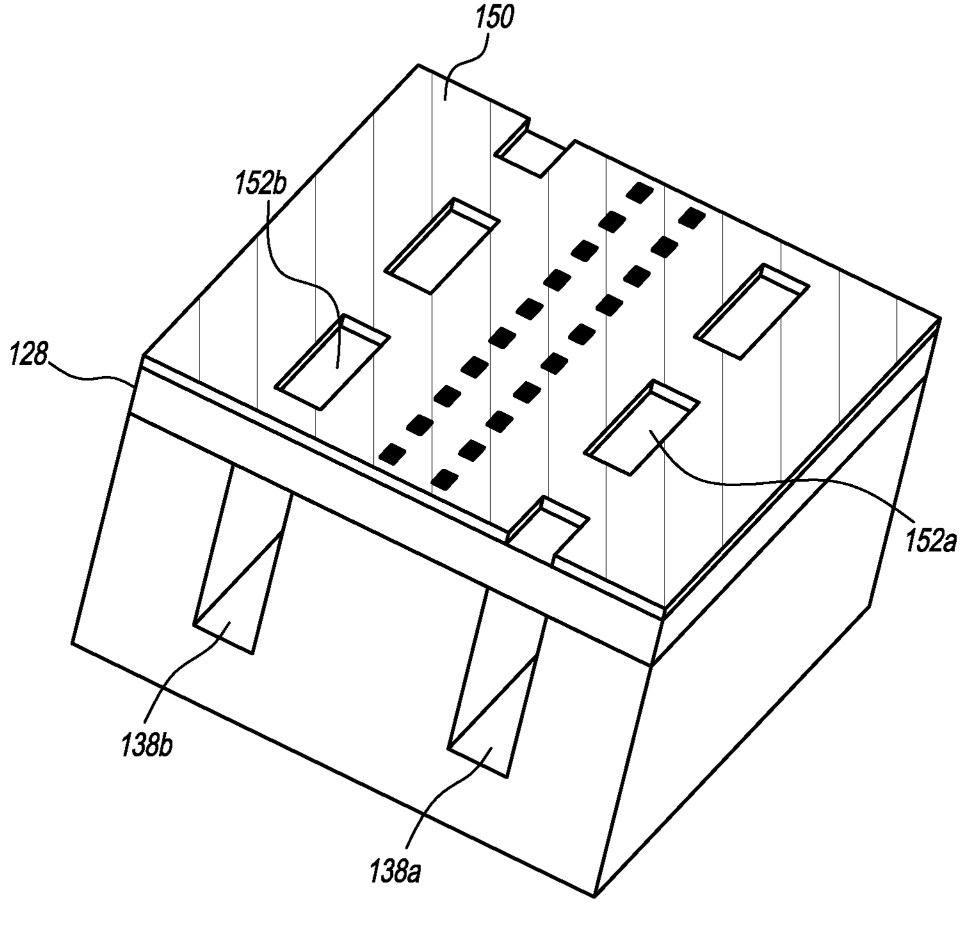
FIG. 33 shows a dielectric layer with feed openings on the planar semiconductor member of FIG. 32.

As shown in FIG. 33 and described in box 106 of FIG. 14, the insulating dielectric layer 150 is patterned and etched through to the planar semiconductor member 128 forming feed openings 152*a* and 152*b*.

Figure 34:
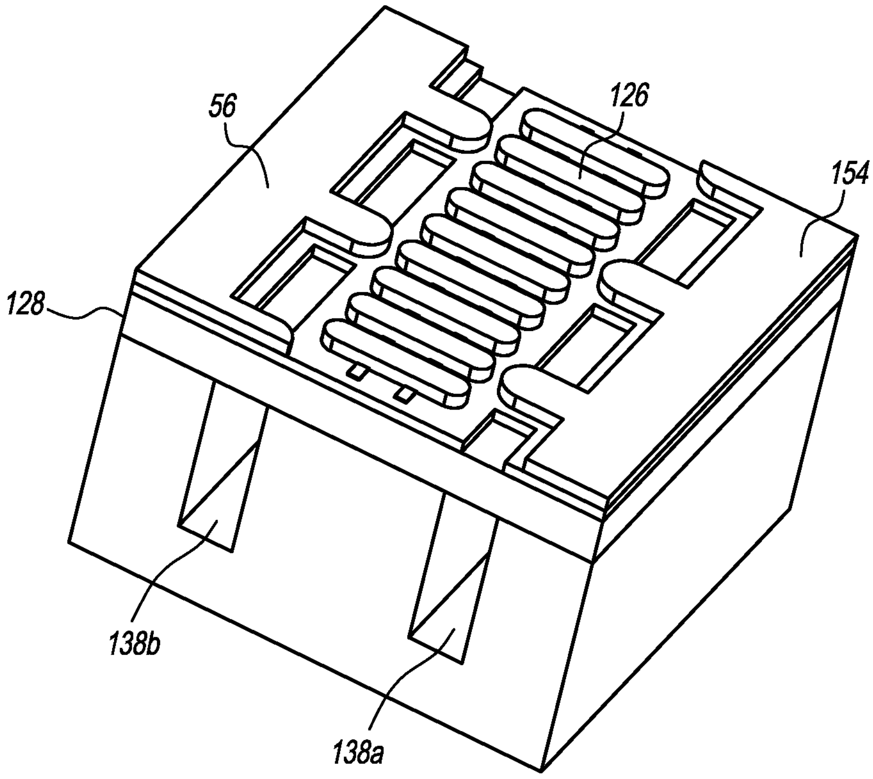
FIG. 34 shows a patterned wall layer formed on the planar semiconductor member of FIG. 33.

As shown in FIG. 34 and described in box 108 of FIG. 14, a wall layer 154 is coated and patterned to form walls 126 between pressurized liquid ejectors 120, as well as an outer passivation layer 156 that extends over the rest of the continuous inkjet printhead 118 to protect the circuitry from the ink. The wall layer 154 can be formed by spin coating, exposure, and development using a photoimageable epoxy such as a novolak resin based epoxy for example TMMR resist available from Tokyo Ohka Kogyo. The thickness of the wall layer 154 is typically in the range 4-25 μm.

Figure 35:
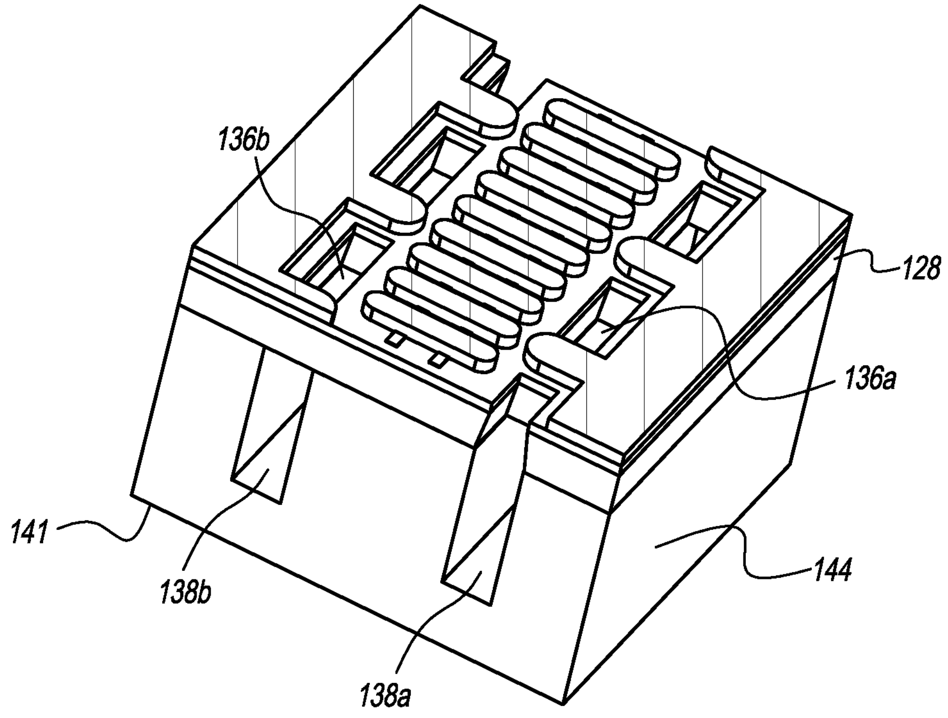
FIG. 35 shows feed holes etched through the planar semiconductor member of FIG. 34.

As shown in FIG. 35 and described in box 110 of FIG. 14, feed holes 136*a*,136*b* are etched through the planar semiconductor member 128 connecting the pressurized liquid ejectors 120 with channels 138*a*,138*b* in the planar substrate member 144. The feed holes 136*a*,136*b* are formed using the feed openings 152*a*,152*b* shown in FIG. 33, as the defining mask and using anisotropic reactive ion etching of the silicon, as is well known in the art.

Figure 36:
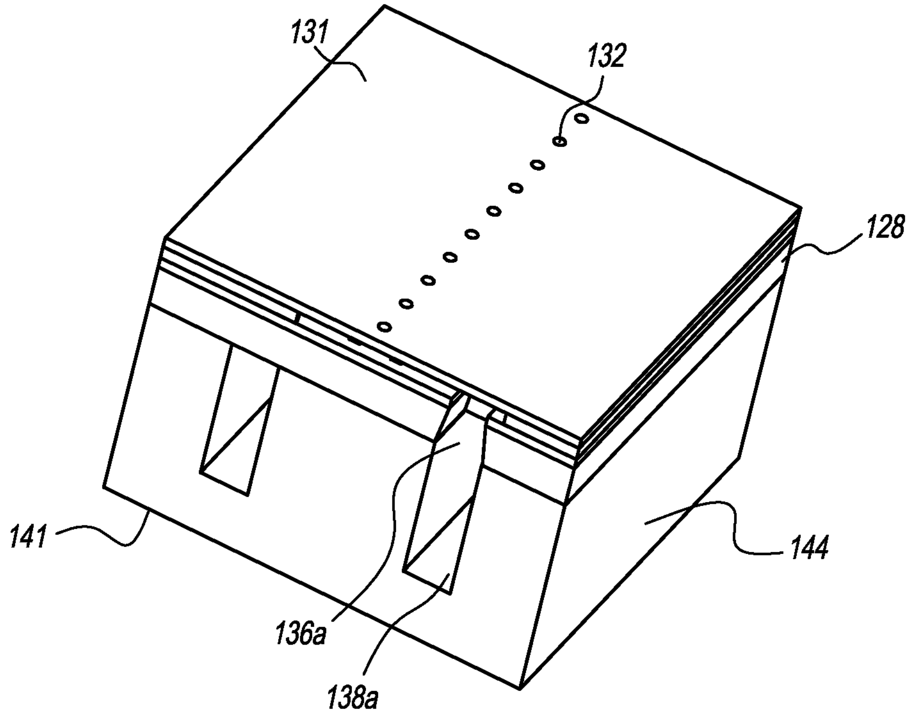
FIG. 36 shows a nozzle plate and nozzles formed on the planar semiconductor member of FIG. 35.

As shown in FIG. 36 and described in box 112 of FIG. 14, a photoimageable nozzle plate layer 131 in the form of a dry film resist is laminated, and patterned to form nozzles 132. The photoimageable nozzle plate layer 131 can be formed using a dry film photoimageable epoxy such as a novolak resin based epoxy for example TMMF dry film resist available from Tokyo Ohka Kogyo. The thickness of the photoimageable nozzle plate layer 131 is typically in the range 5-25 μm and in a preferred embodiment is 10 μm. The use of a dry film laminate for the nozzle plate enables the formation of the nozzle plate layer 131 on the liquid ejection printhead containing high topography features such as the feed holes 136*a*, 136*b*. Up to this point, ink connection holes 140*a* and 140*b* (shown in FIG. 29) have not yet been formed to connect channels 138*a* and 138*b* with second surface 141 of planar substrate member 144. As a result, the ink feed openings 136*a* and 136*b* are not yet connected to the backside (i.e. second surface 141) of the composite substrate, so that there are no difficulties in applying vacuum at second surface 141 to hold down the composite substrate during lamination.

Figure 37:
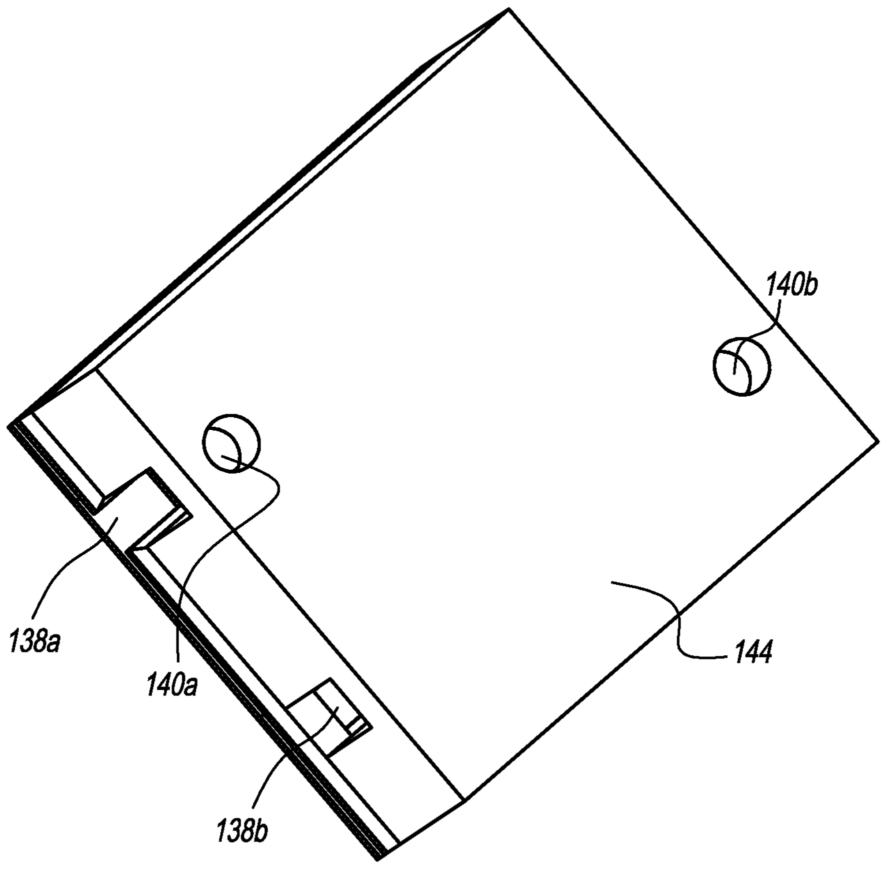
FIG. 37 is a bottom perspective view of the continuous inkjet printhead die of FIG. 29.

As shown in the bottom perspective view of FIG. 37 and described in box 114 of FIG. 14, liquid connection holes 140*a*,140*b* are opened up through the back of the planar substrate member 144 connecting to channels 138*a*,138*b* respectively. Laser drilling or etching of the silicon can form the liquid connection holes 140*a*, 140*b*. The diameter of the liquid ejection holes 140*a*,140*b* is nominally the width of the channels 138*a*,138*b* but can be larger or smaller. The liquid connection holes 140*a*,140*b* are shown in FIG. 37 as circular but they can also be rectangular or elliptical.

As described in box 116 of FIG. 14 and shown in FIGS. 15 and 16, the composite substrate wafer pair 46 is next diced into a plurality (typically several hundred) individual inkjet printhead die 118. As discussed above relative to FIG. 15, because the dicing operation cuts the side edges of inkjet printhead die 118 substantially perpendicular to the plane of composite substrate wafer pair 46, the width and length dimensions of inkjet printhead die 118 are substantially the same for first surface 129 of planar semiconductor member 128 and for second surface 141 of planar substrate member 144.

Figure 38:
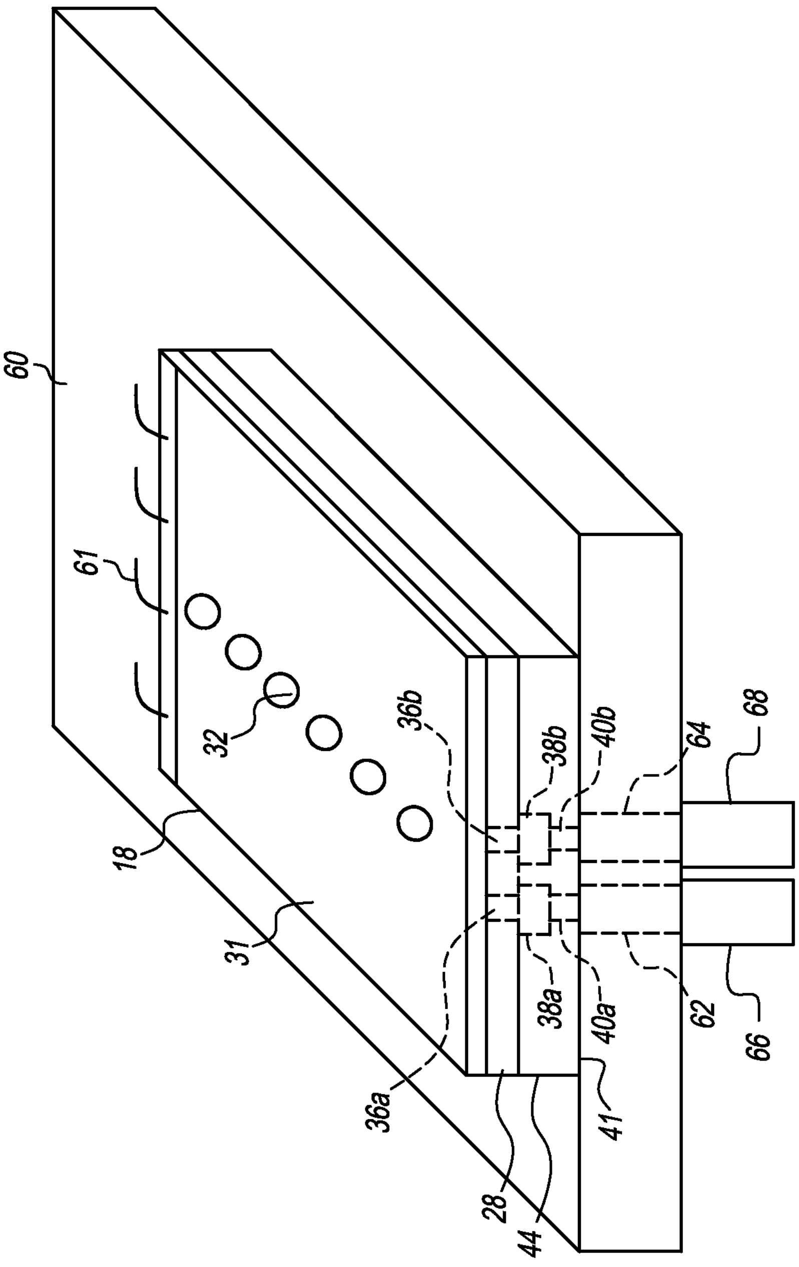
FIG. 38 is a perspective view of the inkjet printhead die of FIG. 17 or FIG. 29 affixed to a mounting substrate.

A DOD or CIJ inkjet printhead can include inkjet printhead die 18 or 118 and a mounting substrate 60 to which the inkjet printhead die is affixed, as shown in FIG. 38. Second surface 41 of planar substrate member 44 is bonded to mounting substrate 60 with an adhesive that can provide mechanical strength, chemical compatibility with ink, a reliable fluidic seal, and optionally good thermal conductivity. Mounting substrate 60 typically includes electrical leads (not shown) as well as one or more ink ports, a first ink port 62 and a second ink port 64 being shown in FIG. 38. First ink port 62 is fluidically connected to ink connection hole 40*a*, and second ink port 64 is fluidically connected to ink connection hole 40*b* (for embodiments such as that shown in FIG. 38 where there is a second ink connection hole 40*b*). A first ink source 66 is fluidically connected to the first ink port 62. For an inkjet printhead die 18 that can eject two different kinds of ink, a second ink source 68 can be connected to second ink port 64. For a CIJ printhead die designed to permit cross-flushing of channels for cleaning, the second ink port 64 on mounting substrate 60 can be fluidically connected to an ink source 68 which in this embodiment acts as an ink sink. By positively pressurizing ink at the first port relative to the second port, a flow of ink can be established. Also shown in FIG. 38 are electrical interconnections 61 (such as wire bonds) between inkjet printhead die 18 and mounting substrate 60.

The invention has been described in detail with particular reference to certain preferred embodiments thereof, but it will be understood that variations and modifications can be effected within the spirit and scope of the invention.

The invention claimed is:

1. An inkjet printhead comprising:

(I) an inkjet printhead die comprising a composite substrate, the composite substrate including:

(i) a single planar semiconductor member comprising:

(a) a first surface having a first width dimension and a first length dimension;

(b) a first ink feed hole;

(c) a second ink feed hole; and (d) an array of nozzles disposed on the first surface;

(ii) a planar substrate member comprising:

(a) a first channel including a bottom;

(b) a second channel including a bottom, the second channel being disposed substantially at a distance d from the first channel;

(c) a second surface that is opposite the first surface of the planar semiconductor member, the second surface having a second width dimension and a second length dimension; wherein the first width dimension and the first length dimension of the first surface of the single planar semiconductor member are respectively the same as the second width dimension and the second length dimension of the second surface of the planar substrate member;

(d) a first ink connection hole extending from the bottom of the first channel to the second surface; and (e) a second ink connection hole extending from the bottom of the second channel to the second surface, wherein a distance D between the first ink connection hole and the second ink connection hole is greater than the distance d; and (iii) an interface at which the single planar semiconductor member is fused to the planar substrate member;

(II) a mounting substrate bonded to the second surface of the inkjet printhead die, the mounting substrate including:

(i) a first ink port that is fluidically connected to the first ink connection hole of the inkjet printhead die; and (ii) a second ink port that is fluidically connected to the second ink connection hole of the inkjet printhead die; and (III) an ink source that is fluidically connected to the first ink port.

2. The inkjet printhead of claim 1, wherein the ink source is a first ink source, wherein the inkjet printhead further comprises a second ink source that is fluidically connected to the second ink port.

3. The inkjet printhead of claim 2, wherein an ink provided by the first ink source is a different type of ink than an ink provided by the second ink source.

4. An inkjet printhead comprising:

(I) an inkjet printhead die comprising a composite substrate, the composite substrate including:

(i) a single planar semiconductor member comprising:

(a) a first surface;

(b) a first ink feed hole;

(c) a second ink feed hole; and (d) an array of nozzles disposed on the first surface;

(ii) a planar substrate member comprising:

(a) a first channel including a bottom;

(b) a second channel including a bottom, the second channel being disposed substantially at a distance d from the first channel;

(c) a second surface that is opposite the first surface of the planar semiconductor member;

(d) a first ink connection hole extending from the bottom of the first channel to the second surface; and (e) a second ink connection hole extending from the bottom of the second channel to the second surface, wherein a distance D between the first ink connection hole and the second ink connection hole is greater than the distance d; and (iii) an interface at which the single planar semiconductor member is fused to the planar substrate member;

(II) a mounting substrate bonded to the second surface of the inkjet printhead die, the mounting substrate including:

(i) a first ink port that is fluidically connected to the first ink connection hole of the inkjet printhead die; and (ii) a second ink port that is fluidically connected to the second ink connection hole of the inkjet printhead die; and (III) an ink source that is fluidically connected to the first ink port;

wherein the first ink port is fluidically connected to an ink sink such that a cross-flushing for cleaning is established by positively pressurizing the ink at the first ink port relative to the ink at the second ink port.

5. The inkjet printhead of claim 1, wherein a distance between the first ink connection hole and the second ink connection hole is greater than 1 mm.

* * * * *